United States Patent
Kono et al.

(10) Patent No.: US 9,952,080 B2
(45) Date of Patent: Apr. 24, 2018

(54) FLOW SENSOR AND MANUFACTURING METHOD FOR THE SAME

(71) Applicant: Hitachi Automotive Systems, Ltd., Hitachinaka-shi, Ibaraki (JP)

(72) Inventors: Tsutomu Kono, Tokyo (JP); Keiji Hanzawa, Ibaraki (JP); Noboru Tokuyasu, Ibaraki (JP); Shinobu Tashiro, Ibaraki (JP); Hiroki Nakatsuchi, Tokyo (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 252 days.

(21) Appl. No.: 14/759,374

(22) PCT Filed: Nov. 18, 2013

(86) PCT No.: PCT/JP2013/081079
§ 371 (c)(1),
(2) Date: Jul. 6, 2015

(87) PCT Pub. No.: WO2014/109132
PCT Pub. Date: Jul. 17, 2014

(65) Prior Publication Data
US 2015/0338258 A1    Nov. 26, 2015

(30) Foreign Application Priority Data
Jan. 11, 2013    (JP) .................................. 2013-003977

(51) Int. Cl.
*G01F 1/34*    (2006.01)
*G01F 15/16*    (2006.01)
(Continued)

(52) U.S. Cl.
CPC .......... *G01F 15/16* (2013.01); *B81C 1/00333* (2013.01); *G01F 1/6845* (2013.01); *G01F 1/692* (2013.01)

(58) Field of Classification Search
CPC .......... G01F 1/34; G01F 1/38; B81C 1/00309
(Continued)

(56) References Cited

U.S. PATENT DOCUMENTS 6,382,023 B1 * 5/2002 Yonezawa ............... G01F 1/684
73/204.22
6,393,907 B1 * 5/2002 Yamakawa ............. G01F 1/684
73/204.26

(Continued)

FOREIGN PATENT DOCUMENTS

CN    102575955 A    7/2012
EP    2 045 584 A2    4/2009
(Continued)

OTHER PUBLICATIONS

Chinese Office Action issued in counterpart Chinese Application No. 201380064443.0 dated Apr. 19, 2017 (eight pages).

(Continued)

*Primary Examiner* — Alexander Mercado
(74) *Attorney, Agent, or Firm* — Crowell & Moring LLP

(57) ABSTRACT

When an exposed part of a semiconductor chip is reduced in size, a tendency of development of a crack on the semiconductor chip is suppressed. A pressure of injection of a resin MR into a second space creates a gap on a contact part SEL where an elastic film LAF and a semiconductor chip CHP1 are in contact, and a resin MR2 different in constituent from the resin MR infiltrates into the gap. As a result, in an area of semiconductor chip CHP1 that is exposed from the resin MR, the resin MR2 is formed in an area other than a flow detecting unit FDU and an area around it. Hence, an area of (Continued)

semiconductor chip CHP1 that is exposed from the resins MR and MR2 can be reduced in size.

4 Claims, 16 Drawing Sheets

(51) Int. Cl.
  *B81C 1/00* (2006.01)
  *G01F 1/684* (2006.01)
  *G01F 1/692* (2006.01)

(58) Field of Classification Search
  USPC ............ 73/23.24, 31.05, 31.06, 204.23, 861, 73/861.42, 861.47; 257/414, 419, 704, 257/E21.503
  See application file for complete search history.

(56) References Cited

U.S. PATENT DOCUMENTS

| | | | |
|---|---|---|---|
| 6,725,716 B1 | 4/2004 | Kawai et al. | |
| 7,192,798 B2 | 3/2007 | Okada et al. | |
| 7,437,927 B2* | 10/2008 | Yamada | G01F 1/6842 73/204.21 |
| 8,640,538 B2 | 2/2014 | Kono et al. | |
| 8,969,977 B2 | 3/2015 | Kono et al. | |
| 9,222,813 B2 | 12/2015 | Kono et al. | |
| 9,222,814 B2 | 12/2015 | Kono et al. | |
| 2005/0279919 A1* | 12/2005 | Tanaka | G01F 1/6845 250/214.1 |
| 2008/0148842 A1* | 6/2008 | Oda | G01F 1/6845 73/204.26 |
| 2009/0199632 A1* | 8/2009 | Toyoda | G01F 1/684 73/204.26 |
| 2011/0140211 A1* | 6/2011 | Kono | G01F 1/684 257/415 |

FOREIGN PATENT DOCUMENTS

| | | |
|---|---|---|
| JP | 59-206715 A | 11/1984 |
| JP | 2000-292236 A | 10/2000 |
| JP | 2003-235830 A | 8/2003 |
| JP | 2004-74713 A | 3/2004 |
| JP | 2006-229108 A | 8/2006 |
| JP | 2010-96614 A | 4/2010 |
| JP | 2010-197102 A | 9/2010 |
| JP | 2011-122984 A | 6/2011 |
| JP | 2012-137505 A | 7/2012 |
| JP | 2012-141316 A | 7/2012 |

OTHER PUBLICATIONS

International Search Report (PCT/ISA/210) dated Dec. 17, 2013, with English translation (four (4) pages).

* cited by examiner

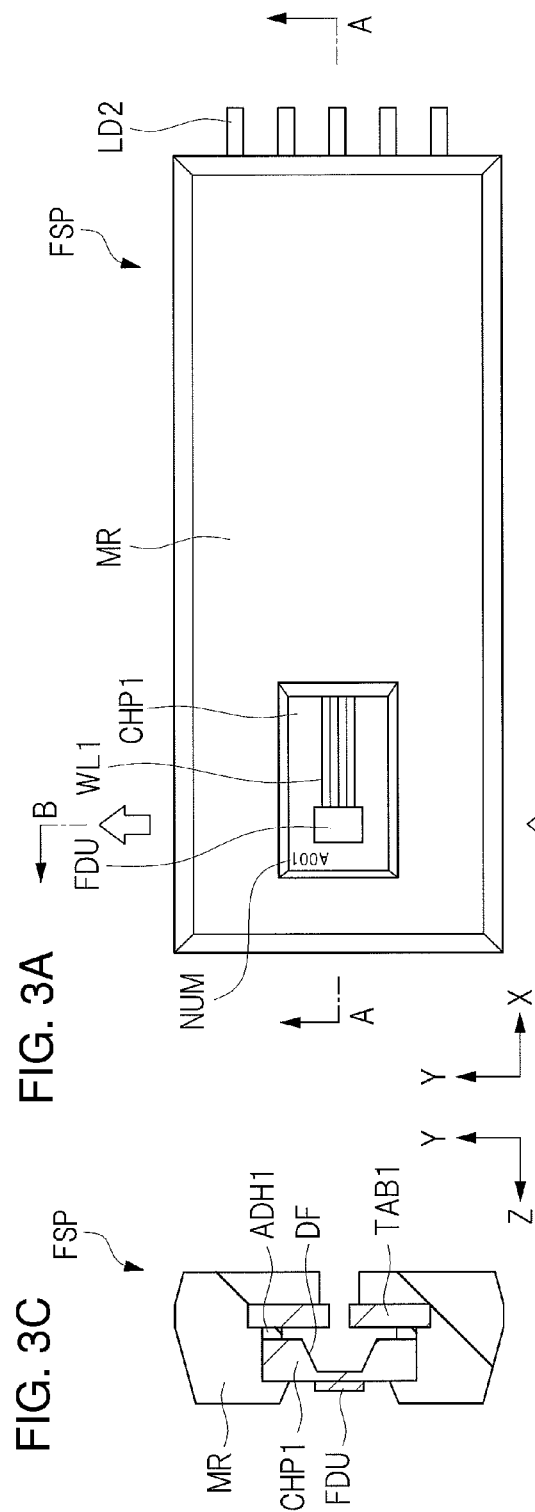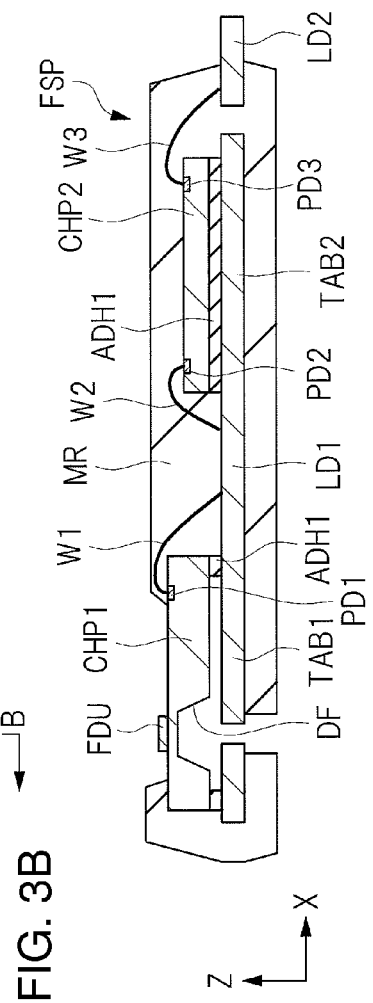

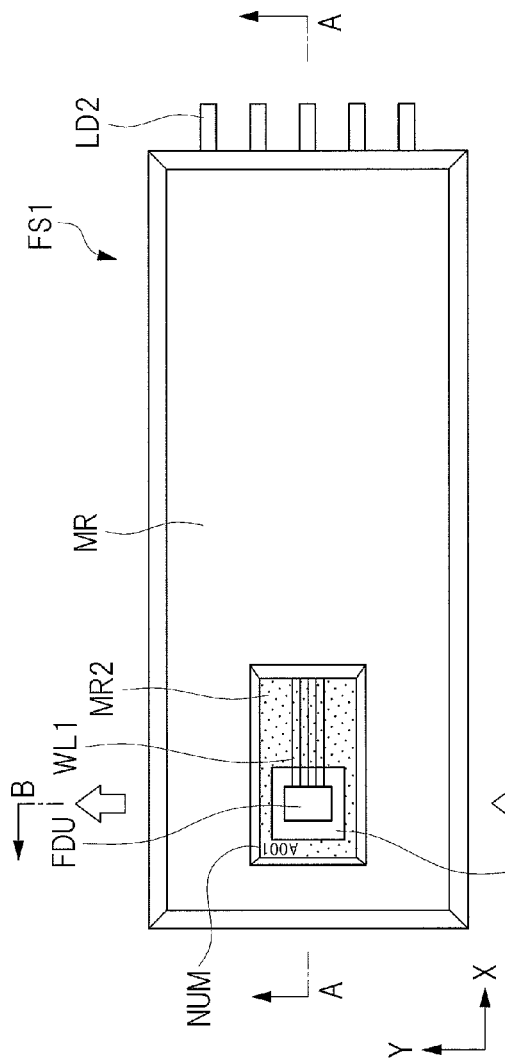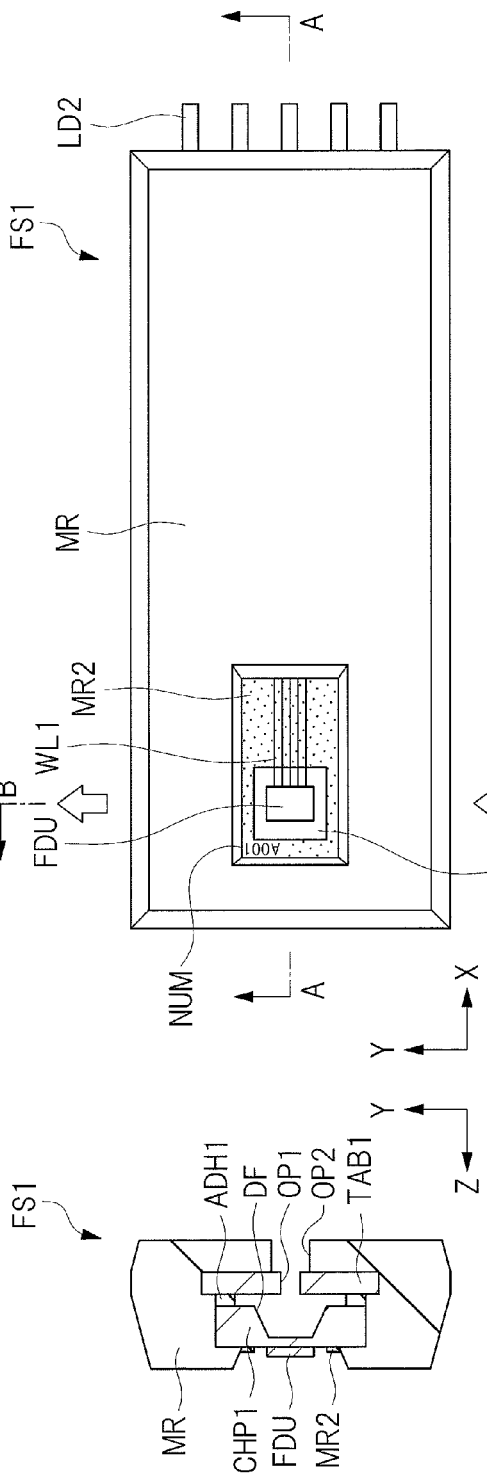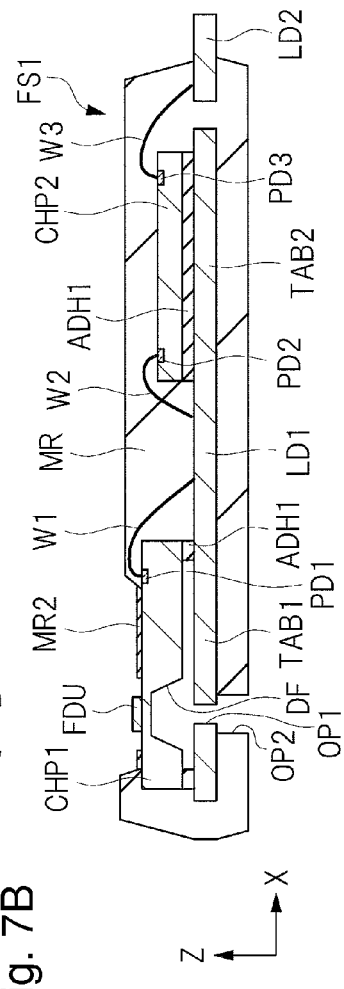

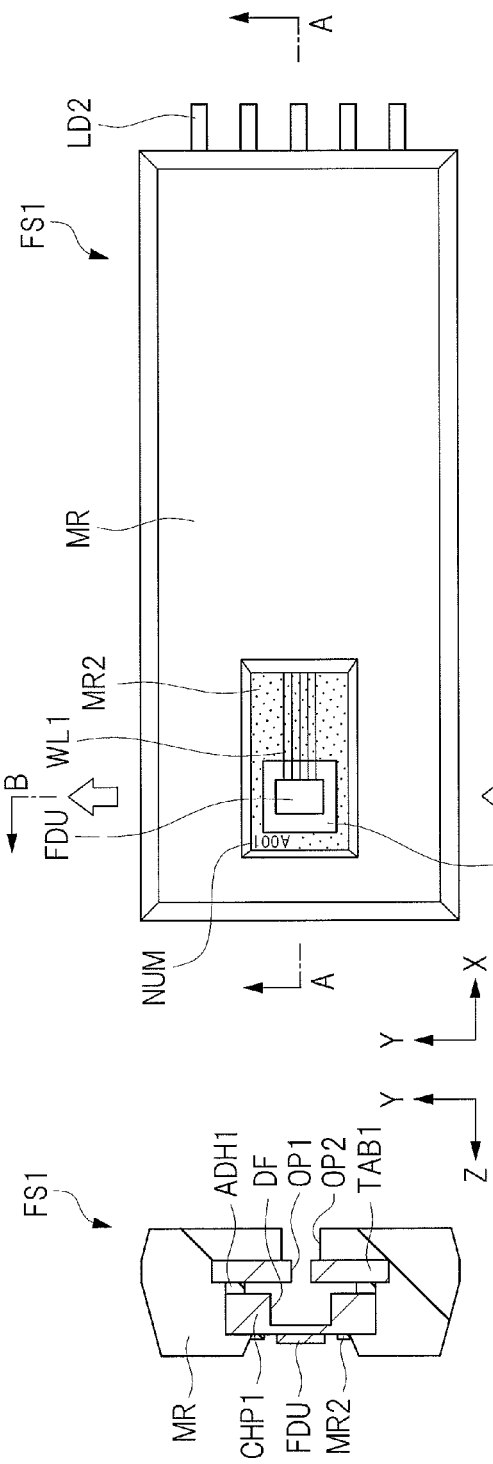

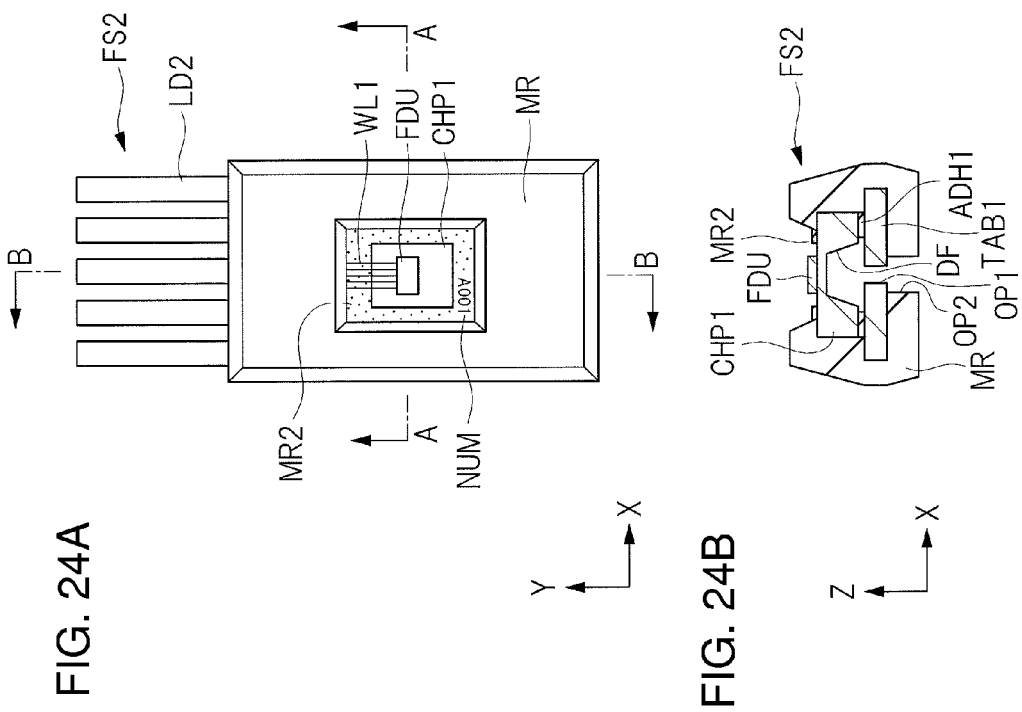

FLOW SENSOR AND MANUFACTURING METHOD FOR THE SAME

TECHNICAL FIELD

The present invention relates to a flow sensor and a manufacturing method for the same and particularly to a technique effectively applied to a resin-sealed flow sensor and a manufacturing method for the same.

BACKGROUND ART

Japanese Patent Application Laid-Open Publication No. 2011-122984 (Patent Document 1) describes a technique of injecting a resin while clamping a base material carrying a semiconductor chip by a mold having an elastic film attached thereto, as a manufacturing method for a flow sensor in which a flow detecting unit that detects a flow of a gas (air) is partially exposed from a sealing body.

Japanese Patent Application Laid-Open Publication No. 2004-74713 (Patent Document 2) describes a technique of clamping a component by a mold having a mold-releasing film sheet attached thereto and injecting a resin, as a manufacturing method for a semiconductor package.

PRIOR ART DOCUMENTS

Patent Documents

Patent Document 1: Japanese Patent Application Laid-Open Publication No. 2011-122984
Patent Document 2: Japanese Patent Application Laid-Open Publication No. 2004-74713

SUMMARY OF THE INVENTION

Problems to be Solved by the Invention

At present, for example, the internal-combustion engine of an automobile, etc., is equipped with an electronic control fuel-injection system. The electronic control fuel-injection system plays a role of letting the internal-combustion engine operate efficiently by properly adjusting the volume of a gas (air) and fuel injected into the internal-combustion engine. The electronic control fuel-injection system, therefore, needs to accurately grasp the status of the gas (air) injected into the internal-combustion engine. For this reason, the electronic control fuel-injection system has a flow sensor (airflow sensor) that measures the flow rate of the gas (air).

Among flow sensors, in particular, a flow sensor manufactured by a semiconductor micromachining technique is attracting a great deal of attention because of its advantages of cost cutting and less power consumption. Such a flow sensor is configured, for example, such that a diaphragm (thin plate) is formed by anisotropic etching on the back surface of a silicon semiconductor substrate and a flow detecting unit composed of a heating resistor and a temperature-measuring resistor is formed on the surface of semiconductor substrate that is opposite to the diaphragm.

In an actual case, for example, the flow sensor includes a first semiconductor chip having the diaphragm and the flow detecting unit and also includes a second semiconductor chip having a control circuit that controls the flow detecting unit. These first and second semiconductor chips are, for example, mounted on the substrate and are electrically connected to lines (terminals) formed on the substrate. Specifically, for example, the first semiconductor chip is connected to lines formed on the substrate via gold wires, while the second semiconductor chip is connected to lines formed on the substrate via bump electrodes formed on the second semiconductor chip.

In this manner, the first and second semiconductor chips formed on the substrate are electrically interconnected via the lines formed on the substrate. As a result, the flow detecting unit formed on the first semiconductor chip can be controlled by the control circuit formed on the second semiconductor chip, and such first and second semiconductor chips make up the flow sensor.

Then, the gold wires connecting the first semiconductor chip to the substrate are usually fixed with a potting resin in order to prevent contact between the wires and other elements that occurs due to deformation of the wires. That is, the gold wires are covered and fixed with the potting resin and are thus protected by the potting resin. On the other hand, the first and second semiconductor chips making up the flow sensor, are usually not sealed with the potting resin. That is, an ordinary flow sensor has a structure in which only the gold wires are covered with the potting resin.

Here, since fixation of the gold wires with the potting resin is not performed in a state where the first semiconductor chip is fixed with molds, etc., there is there is a problem that the shrinkage of the potting resin causes the first semiconductor chip to shift from its proper mounting position. In addition, a fact that a layer of the potting resin is formed by dripping the potting resin leads to another problem that the dimensional precision of the potting resin is low. As a result, at each flow sensor, the mounting position of the first semiconductor chip having the flow detecting unit is shifted and the location of formation of the potting resin varies slightly, and this results in variation in the detection performance of each flow sensor.

Therefore, to suppress the performance variation of each flow sensor, the detection performance of each flow sensor must be compensated, and this creates a need for adding a performance compensating process to a manufacturing process for the flow sensor. Especially, the longer performance compensating process results in a drop in throughput in the manufacturing process for the flow sensor, which leads to a problem of an increase in the cost of the flow sensor.

Further, since the potting resin is not subjected to a heat treatment that accelerates curing of the potting resin, the potting resin takes a longer time to cure, which drops throughput in the manufacturing process for the flow sensor.

An object of the present invention is to provide a technique by which the performance variation of each flow sensor is suppressed to improve the performance of the flow sensor (including a case by which the reliability of the flow sensor is improved to achieve the performance improvement).

Other problems and novel features will be clarified by the descriptive contents and accompanying drawings of this specification.

Means for Solving the Problems

A typical aspect out of aspects of the present invention disclosed herein is briefly described as follows.

For example, a flow sensor according to one embodiment includes a first chip mounting part and a first semiconductor chip mounted on the first chip mounting part, and a part of the first semiconductor chip is sealed with a sealing body as a flow detecting unit formed on the first semiconductor chip is exposed. Then, the sealing body includes a first resin of a first constituent and a second resin of a second constituent which is different from the first constituent.

Further, a manufacturing method for the flow sensor according to the one embodiment includes a process of sealing a part of the first semiconductor chip with the sealing body while leaving the flow detecting unit formed on the first semiconductor chip exposed. In this sealing process, a base material bearing the first semiconductor chip is clamped between an upper mold and a lower mold via a second space as a part of the upper mold is pressed against the surface of the first semiconductor chip via an elastic film to form a first space surrounding the flow detecting unit between the upper mold and the first semiconductor chip. Subsequently, the first resin including a filler and a coloring material is lead into the second space. At this time, a pressure of injection of the first resin causes the second resin different in constituent from the first resin to infiltrate in between the surface of the first semiconductor chip and the elastic film. The volume of the filler and coloring material included in the second resin is smaller than the volume of the filler and coloring material included in the first resin.

Furthermore, a manufacturing method for the flow sensor according to one embodiment includes a process of sealing a part of the first semiconductor chip with the sealing body while leaving the flow detecting unit formed on the first semiconductor chip exposed. In this sealing process, the base material bearing the first semiconductor chip is clamped between the upper mold and the lower mold via the second space while a gap is formed between the surface of the first semiconductor chip and the upper mold and the first space surrounding the flow detecting unit is formed. Subsequently, the first resin including the filler and the coloring material is lead into the second space. At this time, by a pressure of injection of the first resin, the second resin different in constituent from the first resin infiltrates into the gap formed between the surface of the first semiconductor chip and the upper mold. The volume of the filler and coloring material included in the second resin is smaller than the volume of the filler and coloring material included in the first resin.

Effects of the Invention

An effect achieved by a typical aspect out of aspects of the present invention disclosed herein is briefly described as the following.

The performance variation of each flow sensor is suppressed to improve the performance of the flow sensor.

BRIEF DESCRIPTIONS OF THE DRAWINGS

Figure 4:
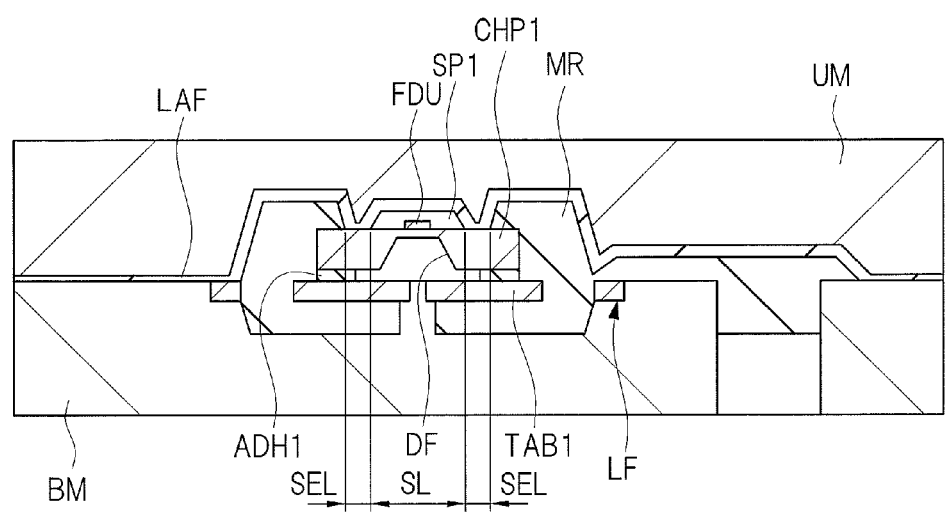
Figure 5:
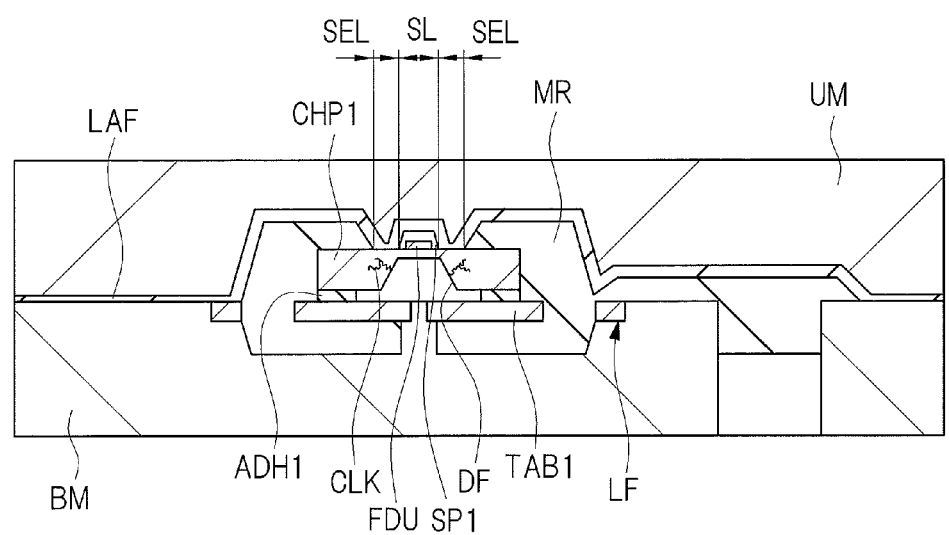
Figure 6A:
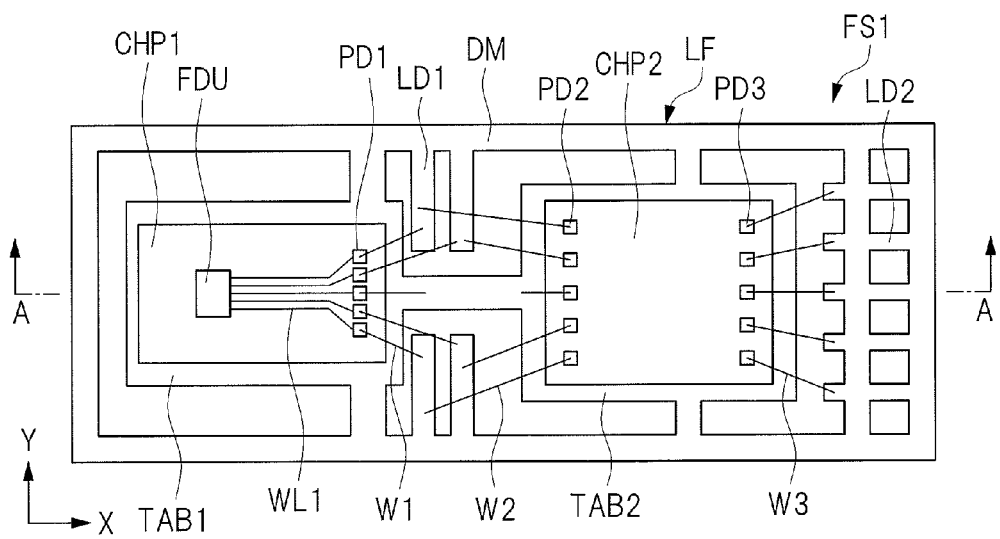
Figure 6B:
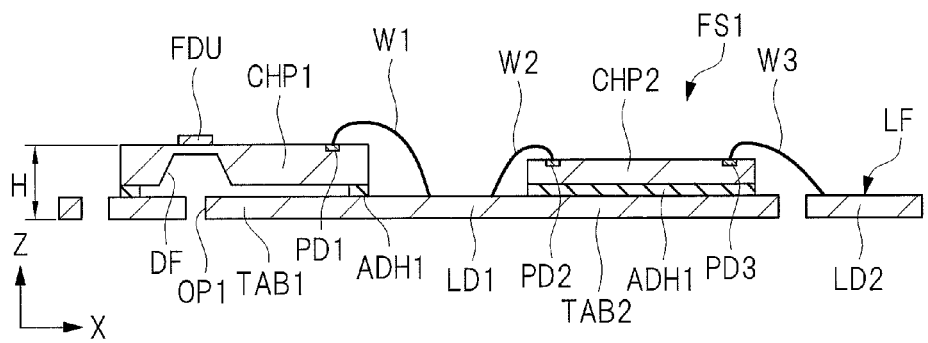
Figure 6C:
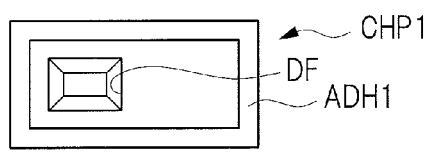
Figure 8:
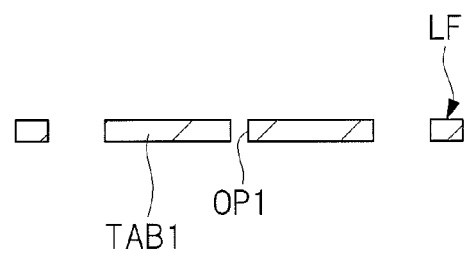
Figure 9:
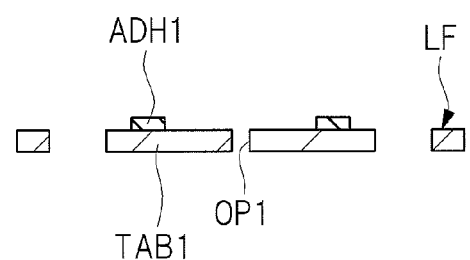
Figure 10:
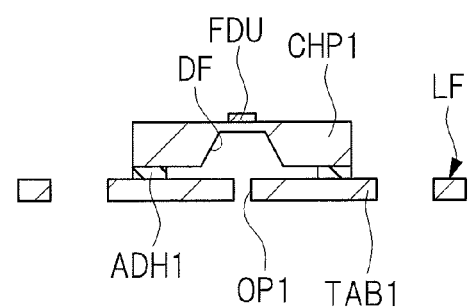
Figure 11:
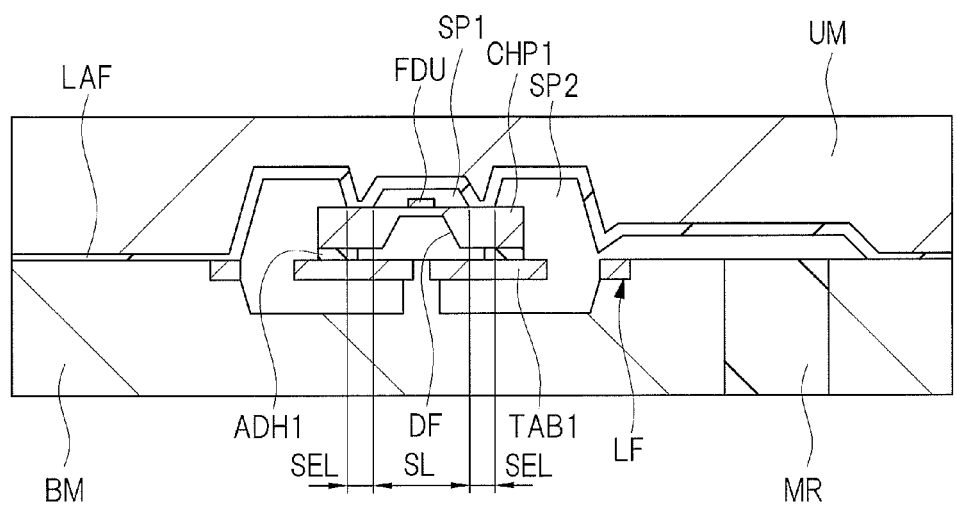
Figure 12:
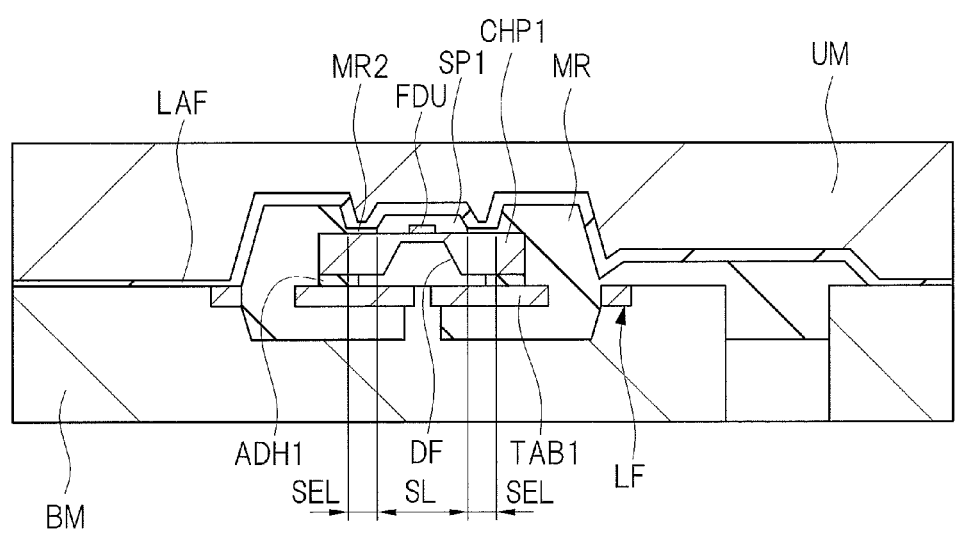
Figure 13:
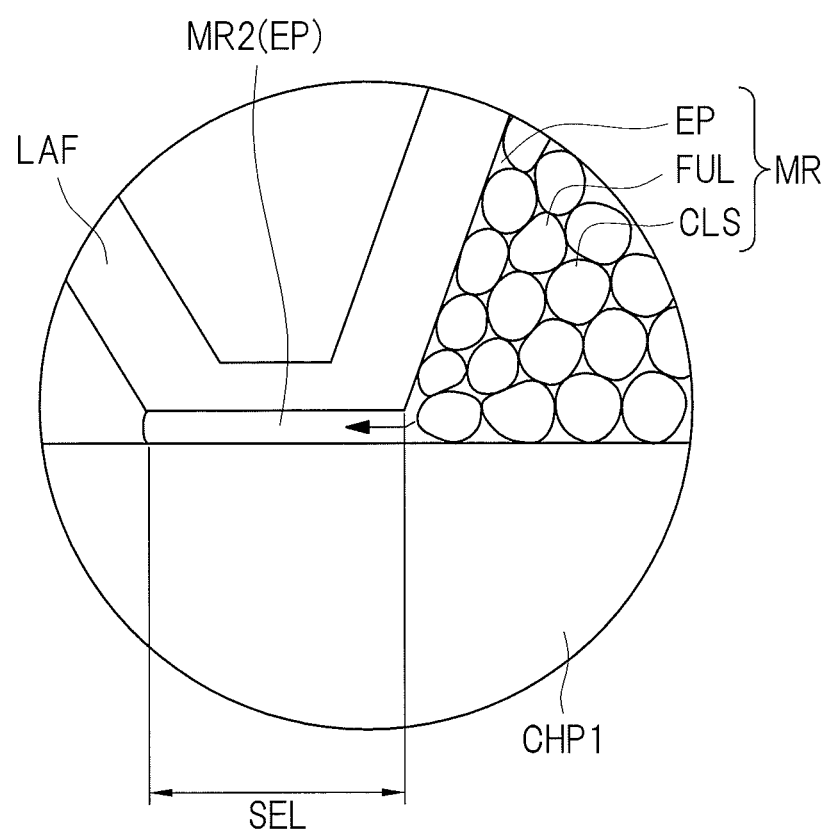
Figure 14:
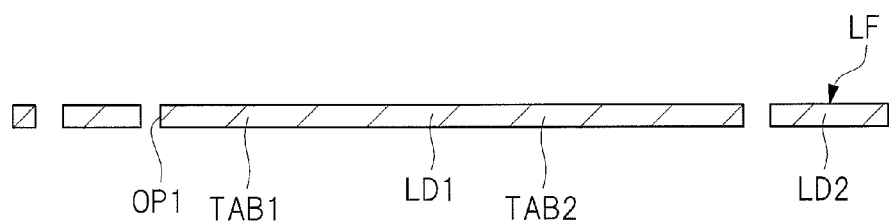
Figure 15:
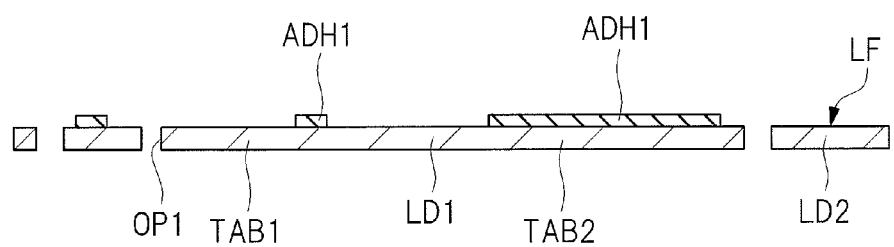
Figure 16:
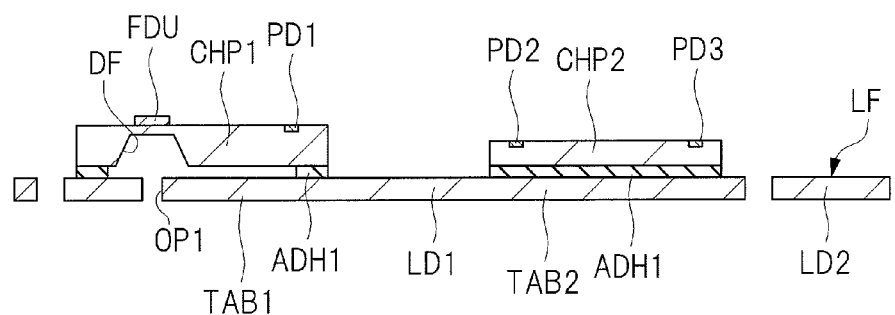
Figure 17:
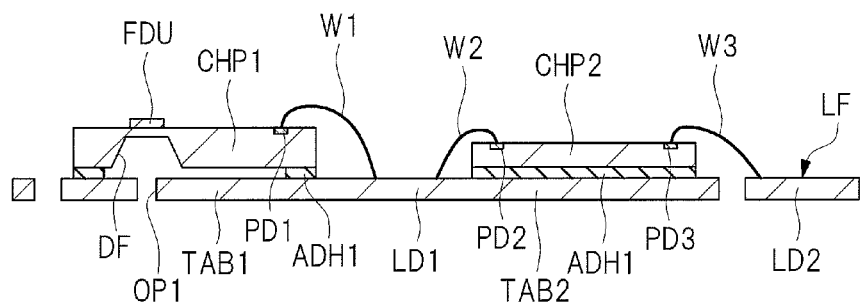
Figure 18:
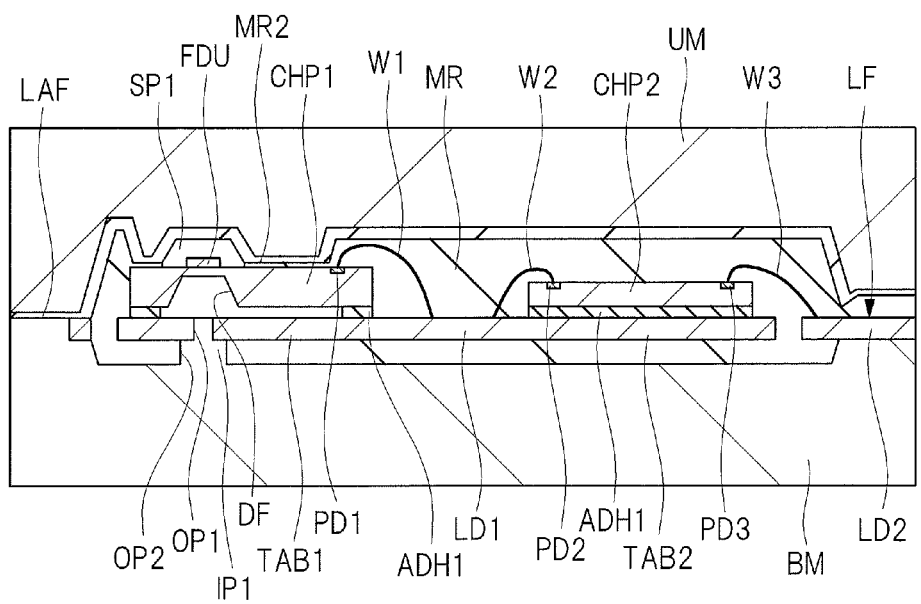
Figure 19:
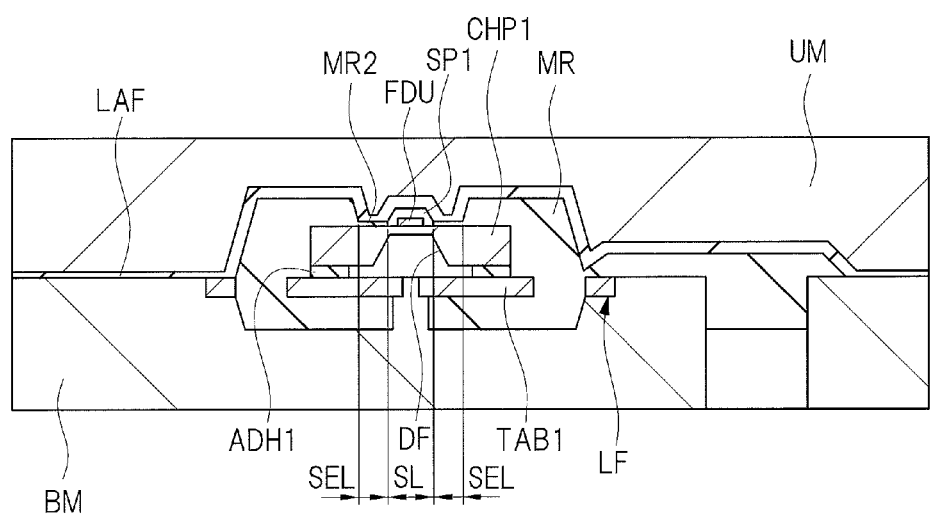
Figure 20:
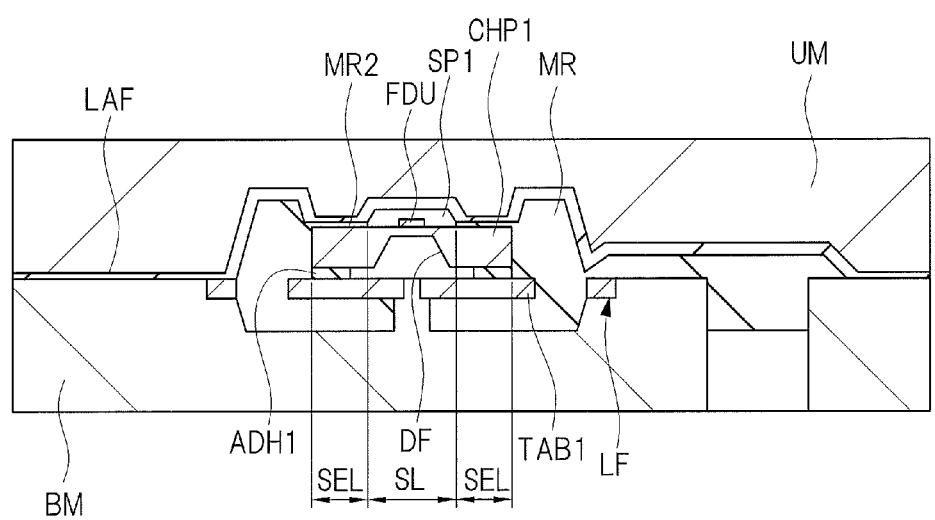
Figure 21:
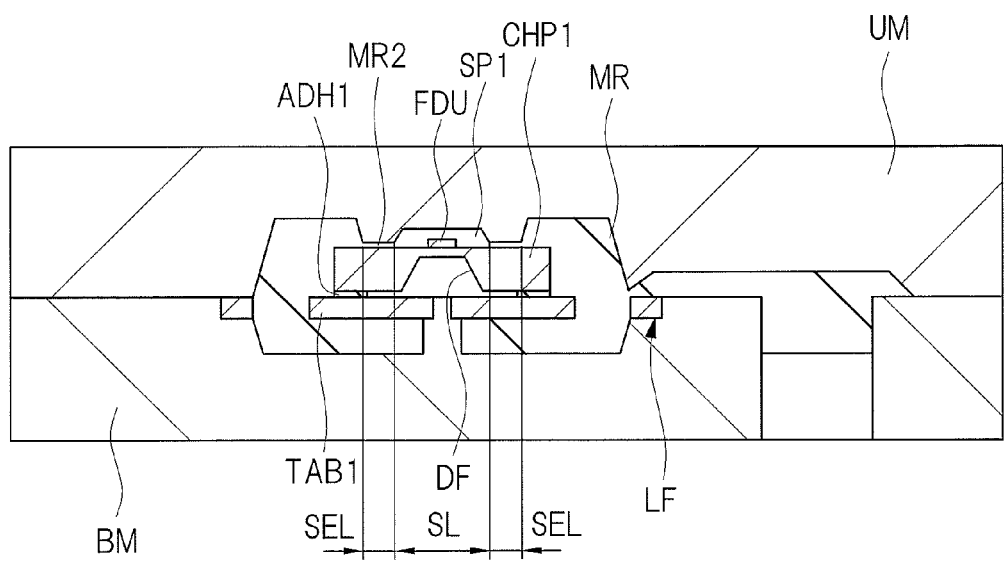
Figure 23A:
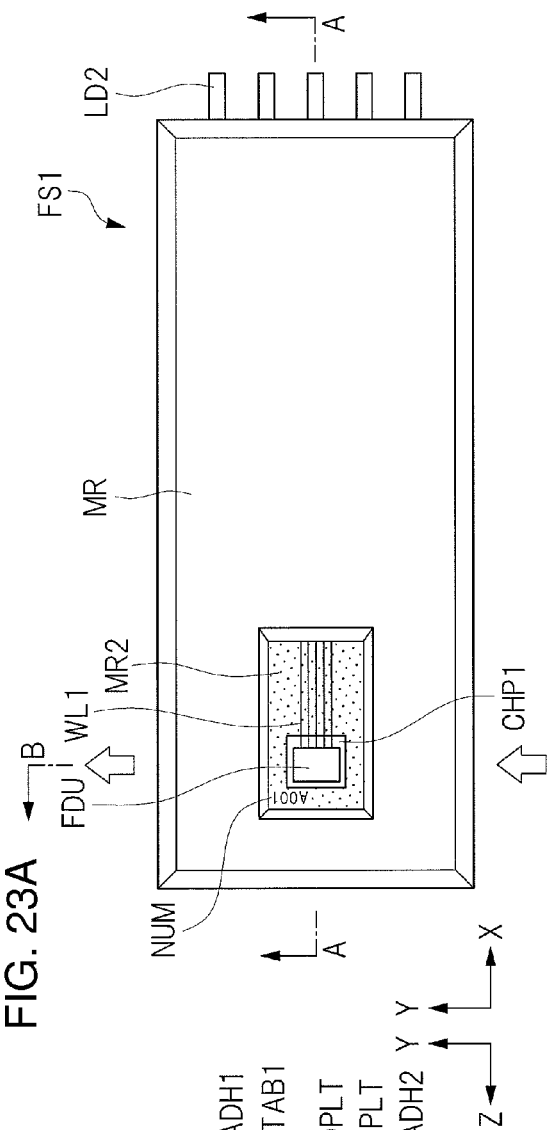
Figure 23C:
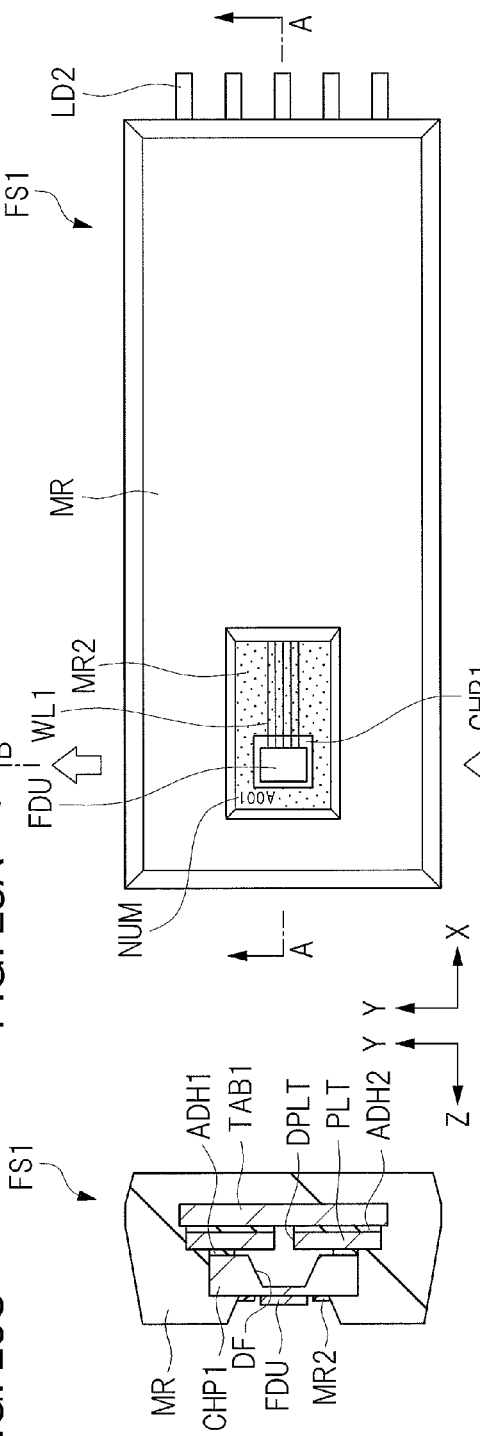
Figure 23B:
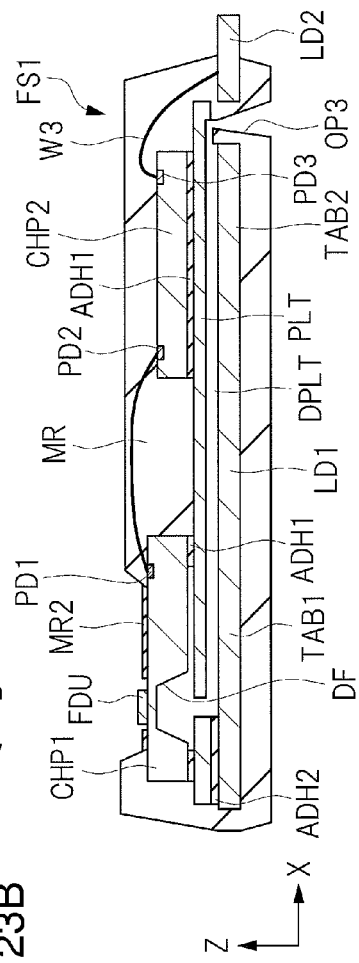

FIG. 3A-3C depicts a mounting configuration of a flow sensor according to a related technique, showing a configuration of the flow sensor sealed with a resin, in which FIG. 3A showing a plan view of a mounting configuration of the flow sensor according to the related technique, FIG. 3B showing a sectional view of FIG. 3A taken along an A-A line, and FIG. 3C showing a sectional view of FIG. 3A taken along a B-B line;

FIG. 4 is a sectional view showing a process of resin-sealing the flow sensor according to the related technique;

FIG. 5 is a sectional view for explaining a disadvantage to be improved included in the related technique;

FIG. 6A-6C depicts a mounting configuration of a flow sensor according to a first embodiment, showing a configuration of the flow sensor not sealed with a resin yet, in which FIG. 6A showing a plan view of a mounting configuration of the flow sensor according to the first embodiment, FIG. 6B showing a sectional view of FIG. 6A taken along an A-A line, and FIG. 6C showing a plan view of the back surface of the semiconductor chip;

FIG. 7A-7C depicts amounting configuration of the flow sensor according to the first embodiment, showing a configuration of the flow sensor sealed with a resin, in which FIG. 7A showing a plan view of a mounting configuration of the flow sensor according to the first embodiment, FIG. 7A showing a sectional view of FIG. 7A taken along an A-A line, and FIG. 7C showing a sectional view of FIG. 7A taken along a B-B line;

FIG. 8 is a sectional view showing a manufacturing process for the flow sensor according to the first embodiment;

FIG. 9 is a sectional view showing a manufacturing process for the flow sensor that follows the manufacturing process of FIG. 8;

FIG. 10 is a sectional view showing a manufacturing process for the flow sensor that follows the manufacturing process of FIG. 9;

FIG. 11 is a sectional view showing a manufacturing process for the flow sensor that follows the manufacturing process of FIG. 10;

FIG. 12 is a sectional view showing a manufacturing process for the flow sensor that follows the manufacturing process of FIG. 11;

FIG. 13 is an enlarged view of a state in which a gap is formed on a contact part where an elastic film and the semiconductor chip are in contact by a resin injection pressure;

FIG. 14 is a sectional view showing a manufacturing process for the flow sensor according to the first embodiment;

FIG. 15 is a sectional view showing a manufacturing process for the flow sensor that follows the manufacturing process of FIG. 14;

FIG. 16 is a sectional view showing a manufacturing process for the flow sensor that follows the manufacturing process of FIG. 15;

FIG. 17 is a sectional view showing a manufacturing process for the flow sensor that follows the manufacturing process of FIG. 16;

FIG. 18 is a sectional view showing a manufacturing process for the flow sensor that follows the manufacturing process of FIG. 17;

FIG. 19 is a sectional view showing a resin-sealing process on a flow sensor according to a first modification;

FIG. 20 is a sectional view showing a resin-sealing process on a flow sensor according to a second modification;

FIG. 21 is a sectional view showing a resin-sealing process on a flow sensor according to a third modification;

FIG. 22A-22C depicts the structure of a flow sensor sealed with a resin, according to a second embodiment, in which FIG. 22A showing a plan view of the structure of the flow sensor sealed with the resin, FIG. 22B showing a sectional view of FIG. 22A taken along an A-A line, and FIG. 22C showing a sectional view of FIG. 22A taken along a B-B line;

FIG. 23A-23C depicts amounting configuration of a flow sensor according to a third embodiment, showing a configuration of the flow sensor sealed with a resin, in which FIG. 23A showing a plan view of amounting configuration of the flow sensor according to the third embodiment, FIG. 23B showing a sectional view of FIG. 23A taken along an A-A line, and FIG. 23C showing a sectional view of FIG. 23A taken along a B-B line; and FIG. 24A-24C depicts amounting configuration of a flow sensor according to a fourth embodiment, showing a configuration of the flow sensor sealed with a resin, in which FIG. 24A showing a plan view of a mounting configuration of the flow sensor according to the fourth embodiment, FIG. 24B showing a sectional view of FIG. 24A taken along an A-A line, and FIG. 24C showing a sectional view of FIG. 24A taken along a B-B line.

DETAILED DESCRIPTION OF PREFERRED EMBODIMENTS

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle.

Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Also, the same components h are denoted by the same reference symbols throughout all the drawings for describing the embodiments, and the repetitive description thereof is omitted. Note that, hatching is used in some cases even in a plan view so as to make the drawings easy to see.

First Embodiment

<Circuit Configuration of Flow Sensor>

Figure 1:
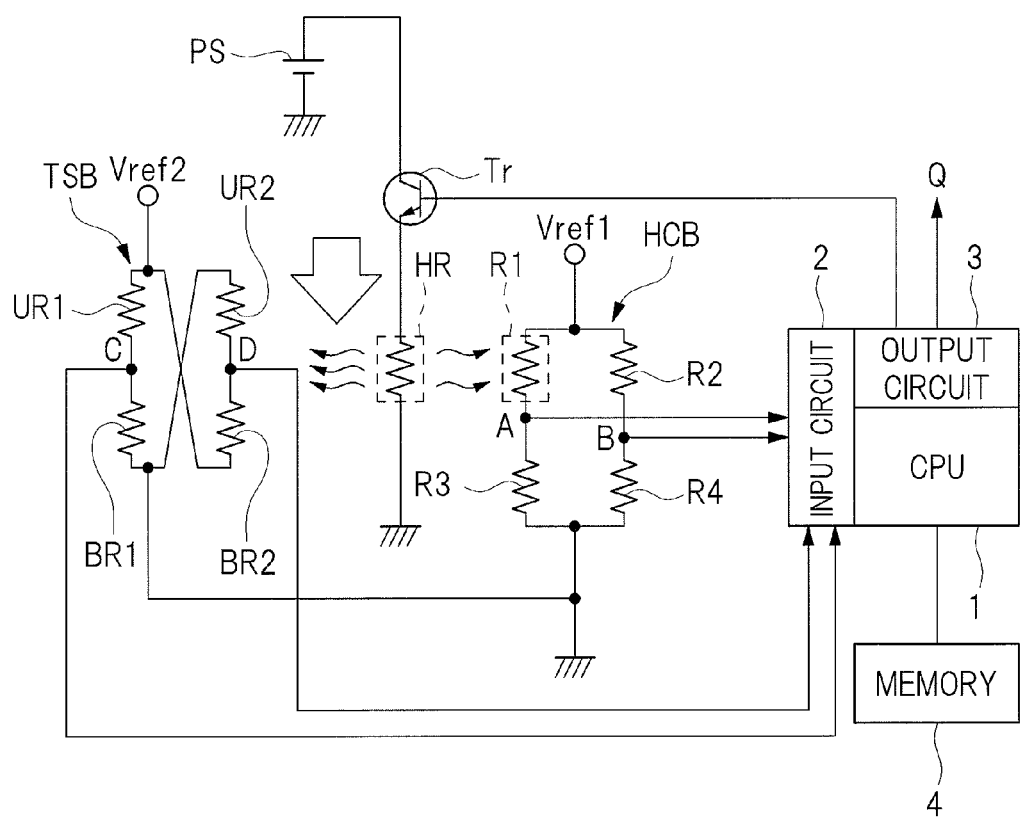
FIG. 1 is a circuit block diagram of a circuit configuration of a flow sensor according to a first embodiment.

A circuit configuration of a flow sensor will first be described. FIG. 1 is a circuit block diagram of a circuit configuration of a flow sensor according to a first embodiment. In FIG. 1, the flow sensor of the first embodiment includes a CPU (Central Processing Unit) 1 that controls the flow sensor, an input circuit 2 that inputs an input signal to the CPU 1, and an output circuit 3 that outputs an output signal from the CPU 1. The flow sensor also includes a memory 4 that stores data therein, and the CPU 1 accesses the memory 4 to be able to refer to data stored in the memory 4.

The CPU 1 is connected to the base electrode of a transistor Tr via the output circuit 3. The collector electrode of the transistor Tr is connected to a power supply PS, while the emitter electrode of the transistor Tr is connected to a ground (GND) node via a heating resistor HR. The transistor Tr is thus controlled by the CPU 1. Because the base electrode of the transistor Tr is connected to the CPU 1 via the output circuit 3, an output signal from the CPU 1 is input to the base electrode of the transistor Tr.

As a result, a current flowing through the transistor Tr is controlled by the output signal (control signal) from the CPU 1. When the current flowing through the transistor Tr is increased by the output signal from the CPU 1, a current supplied from the power supply PS to the heating resistor HR consequently increases, which causes the amount of heat of the heating resistor HR to become larger.

On the other hand, when the output signal from the CPU 1 decreases the current flowing through the transistor Tr, the current supplied from the power supply PS to the heating resistor HR consequently decreases, which causes the amount of heat of the heating resistor HR to become smaller.

In this manner, the flow sensor of the first embodiment is configured such that the CPU 1 controls the amount of a current flowing through the heating resistor HR, thereby controls the amount of heat generated by the heating resistor HR.

Subsequently, the flow sensor of the first embodiment provided with a heater control bridge HCB for controlling a current flowing through the heating resistor HR by the CPU 1. The heater control bridge HCB detects the amount of heat released from the heating resistor HR and outputs the result of the detection to the input circuit 2. As the result of this, the CPU 1 can input the result of the detection from the heater control bridge HCB and controls a current flowing through the transistor Tr based on the incoming result of the detection.

Specifically, as shown in FIG. 1, the heater control bridge HCB has resistors R1 to R4 making up a bridge between a reference voltage node Vref1 and a ground (GND) node. In the heater control bridge HCB having such a configuration, the resistance values of the resistors R1 to R4 are so determined that when the temperature of a gas heated by the heating resistor HR is higher than an intake-air temperature by a given temperature (ΔT, e.g., 100° C.), a potential difference between a node A and a node B is 0 V. In other words, the resistors R1 to R4 making up the heater control bridge HCB are arranged into a bridge structure in which a constituent element composed of the resistors R1 and R3 connected in series to each other and a constituent element composed of the resistors R2 and R4 connected in series to each other are connected in parallel between the reference voltage node Vref1 and the ground (GND) node. A junction between the resistor R1 and the resistor R3 is equivalent to the node A, while a junction between the resistor R2 and the resistor R4 is equivalent to the node B.

At this time, a gas heated by the heating resistor HR comes in contact with the resistor R1 making up the heater control bridge HCB. The resistance value of the resistor R1 making up the heater control bridge HCB, therefore, changes mainly depending on the amount of heat generated by the heating resistor HR. When the resistance value of the resistor R1 changes in this manner, a potential difference between the node A and the node B consequently changes. Since this changed potential difference between the node A and the node B is input to the CPU 1 via the input circuit 2, the CPU 1 controls a current flowing through the transistor Tr based on the potential difference between the node A and the node B.

Specifically, the CPU 1 controls a current flowing through the transistor TR, thereby controls the amount of heat generated by the heating resistor HR so that the potential difference between the node A and the node B is fixed to 0 V. In other words, the flow sensor of the first embodiment is configured such that based on output from the heater control bridge HCB, the CPU 1 performs feedback control by which the temperature of a gas heated by the heating resistor HR is kept at a given temperature that is higher than the air-intake temperature by the given temperature ($\Delta T$, e.g., 100° C.)

Subsequently, the flow sensor of the first embodiment includes a temperature sensor bridge TSB that detects the flow rate of a gas. The temperature sensor bridge TSB is composed of four temperature-measuring resistors making up a bridge between a reference voltage node Vref2 and the ground node (GND). These four temperature-measuring resistors consist of two upstream temperature-measuring resistors UR1 and UR2 and two downstream temperature-measuring resistors BR1 and BR2.

An arrow shown in FIG. 1 indicates the direction of flow of a gas, and the upstream temperature-measuring resistors UR1 and UR2 are disposed on the upstream-side of the direction of flow of the gas, while the downstream temperature-measuring resistors BR1 and BR2 are disposed on the downstream-side of the same. These upstream temperature-measuring resistors UR1 and UR2 and the downstream temperature-measuring resistors BR1 and BR2 are so arranged that the distance from the upstream temperature-measuring resistors UR1 and UR2 and the downstream temperature-measuring resistors BR1 and BR2 to the heating resistor HR is the same with each other.

In the temperature sensor bridge TSB, the upstream temperature-measuring resistor UR1 and the downstream temperature-measuring resistor BR1 are connected in series to each other between the reference voltage node Vref2 and the ground (GND), and a junction between the upstream temperature-measuring resistor UR1 and the downstream temperature-measuring resistor BR1 is equivalent to a node C.

On the other hand, the upstream temperature-measuring resistor UR2 and the downstream temperature-measuring resistor BR2 are also connected in series to each other between the ground (GND) and the reference voltage node Vref2, and a junction between the upstream temperature-measuring resistor UR2 and the downstream temperature-measuring resistor BR2 is equivalent to a node D. A potential at the node C and a potential at the node D are input to the CPU 1 via the input circuit 2. Each of the resistance values of the upstream temperature-measuring resistors UR1 and UR2 and downstream temperature-measuring resistors BR1 and BR2 is so determined that in a windless condition, that is, when the flow rate of the gas flowing in the arrowed direction is zero, a difference between the potential at the node C and the potential at the node D is 0 V.

Specifically, the upstream temperature-measuring resistors UR1 and UR2 and the downstream temperature-measuring resistors BR1 and BR2 are so configured that the distance from the upstream temperature-measuring resistors UR1 and UR2 and the downstream temperature-measuring resistors BR1 and BR2 to the heating resistor HR is the same with each other, and that they are identical in resistance value with each other. Because of this configuration, in the temperature sensor bridge TSB, the potential difference between the node C and the node D is kept at 0 V in a windless condition, regardless the volume of heat generated by the heating resistor HR.

<Operation of Flow Sensor>

The flow sensor of the first embodiment is configured in the above manner, and the operation of the flow sensor will hereinafter be described, referring to FIG. 1. At first, the CPU 1 outputs an output signal (control signal) to the base electrode of the transistor Tr via the output circuit 3, thereby causes a current to flow through the transistor Tr. As a result, a current flows from the power supply PS, which is connected to the collector electrode of the transistor Tr, to the heating resistor HR, which is connected to the emitter electrode of the transistor Tr. This current flow causes the heating resistor HR to generate heat. Then, a gas heated by the heat from the heating resistor HR heats the resistor R1 making up the heater control bridge HCB.

At this time, each of the resistance values of the resistors R1 to R4 is so determined that when the temperature of the gas heated by the heating resistor HR is higher than the intake-air temperature by the given temperature (e.g., 100° C.), a potential difference between the node A and the node B of the heater control bridge HCB is 0 V. Therefore, when the temperature of the gas heated by the heating resistor HR is higher than the intake-air temperature by the given temperature (e.g., 100° C.), therefore, the potential difference between the node A and the node B of the heater control bridge HCB is kept at 0 V, and this potential difference (0 V) is input to the CPU 1 via the input circuit 2. Recognizing that the potential difference at the heater control bridge HCB is 0 V, the CPU 1 outputs an output signal (control signal) for maintaining the present current volume, to the base electrode of the transistor Tr via the output circuit 3.

On the other hand, when the temperature of the gas heated by the heating resistor HR is shifted from the temperature that is higher than the intake-air temperature by the given temperature (e.g., 100° C.), a non-zero potential difference is created between the node A and the node B of the heater control bridge HCB and this non-zero potential difference is input to the CPU 1 via the input circuit 2. Recognizing that the non-zero potential difference is created at the heater control bridge HCB, the CPU 1 outputs an output signal (control signal) that makes the potential difference to 0 V, to the base electrode of the transistor Tr via the output circuit 3.

For example, when a potential difference is created as a result of the temperature of the gas heated by the heating resistor HR rising above the temperature that is higher than the intake-air temperature by the given temperature (e.g., 100° C.), the CPU 1 outputs an output signal (control signal) that reduces a current flowing through the transistor Tr, to the base electrode of the transistor Tr. On the other hand, when a potential difference is created as a result of the temperature of the gas heated by the heating resistor HR dropping below the temperature that is higher than the intake-air temperature by the given temperature (e.g., 100° C.), the CPU 1 outputs an output signal (control signal) that increases a current flowing through the transistor Tr, to the base electrode of the transistor Tr.

In the above manner, the CPU 1 performs feedback control based on an output signal from the heater control bridge HCB so that the potential difference between the node A and the node B of the heater control bridge HCB is kept at 0 V (equilibrium). From this, it is admitted that the flow sensor of the first embodiment performs controls to keep the gas heated by the heating resistor HR at the given temperature.

Next, an operation of gas flow rate measurement carried out by the flow sensor of the first embodiment will be described. At first, a case of a windless condition will be described. In a windless condition where the flow rate of a gas flowing in the arrowed direction is zero, each of the resistance values of the upstream temperature-measuring resistors UR1 and UR2 and downstream temperature-measuring resistors BR1 and BR2 is so determined that a potential difference between the node C and the node D of the temperature sensor bridge TSB is 0 V.

Specifically, the upstream temperature-measuring resistors UR1 and UR2 and the downstream temperature-measuring resistors BR1 and BR2 are so configured that the distance from the upstream temperature-measuring resistors UR1 and UR2 and the downstream temperature-measuring resistors BR1 and BR2 to the heating resistor HR is the same with each other, and that they are identical in resistance value with each other. Because of this configuration, in the temperature sensor bridge TSB, the potential difference between the node C and the node D is kept at 0 V in a windless condition, regardless the volume of heat generated by the heating resistor HR, and this potential difference (0 V) is input to the CPU 1 via the input circuit 2. Recognizing that the potential difference at the temperature sensor bridge TSB is 0 V, the CPU 1 also recognizes that the flow rate of the gas flowing in the arrowed direction is zero, and as a result, the flow sensor of the first embodiment outputs an output signal indicative of a gas flow rate Q being zero via the output circuit 3.

Next, a case where a gas flows in the arrowed direction of FIG. 1 is considered. In this case, as shown in FIG. 1, the upstream temperature-measuring resistors UR1 and UR2 located on the upstream-side of the direction of flow of the gas are cooled by the gas flowing in the arrowed direction. As a result, the temperature of the upstream temperature-measuring resistors UR1 and UR2 drops. Meanwhile, the downstream temperature-measuring resistors BR1 and BR2 located on the downstream-side of the direction of flow of the gas are made their temperature raised, because the gas heated by the heating resistor HR flows toward the downstream temperature-measuring resistors BR1 and BR2. Hence the temperature sensor bridge TSB loses its temperature balance, which creates a non-zero potential difference between the node C and the node D of the temperature sensor bridge TSB.

This non-zero potential difference is input to the CPU 1 via the input circuit 2. Recognizing that the potential difference at the temperature sensor bridge TSB is not zero, the CPU 1 also recognizes that the flow rate of the gas flowing in the arrowed direction is not zero. Then, the CPU 1 accesses the memory 4. Since a comparison table correlating potential differences with gas flow rates is stored in the memory 4. Accessing the memory 4, the CPU 1 calculates a gas flow rate Q from the comparison table stored in the memory 4. The gas flow rate Q calculated by the CPU 1 is then output from the flow sensor of the first embodiment via the output circuit 3. In this manner, the flow sensor of the first embodiment can obtain the flow rate of a gas.

<Layout of Flow Sensor>

A layout of the flow sensor of the first embodiment will then be described. For example, the flow sensor of the first embodiment shown in FIG. 1 is composed of two semiconductor chips. Specifically, the heating resistor HR, heater control bridge HCB, and temperature sensor bridge TSB are formed on one semiconductor chip while the CPU 1, input circuit 2, output circuit 3, and memory 4 etc. are formed on the other semiconductor chip. A layout of the semiconductor chip carrying the heating resistor HR, heater control bridge HCB, and temperature sensor bridge TSB will hereinafter be described.

Figure 2:
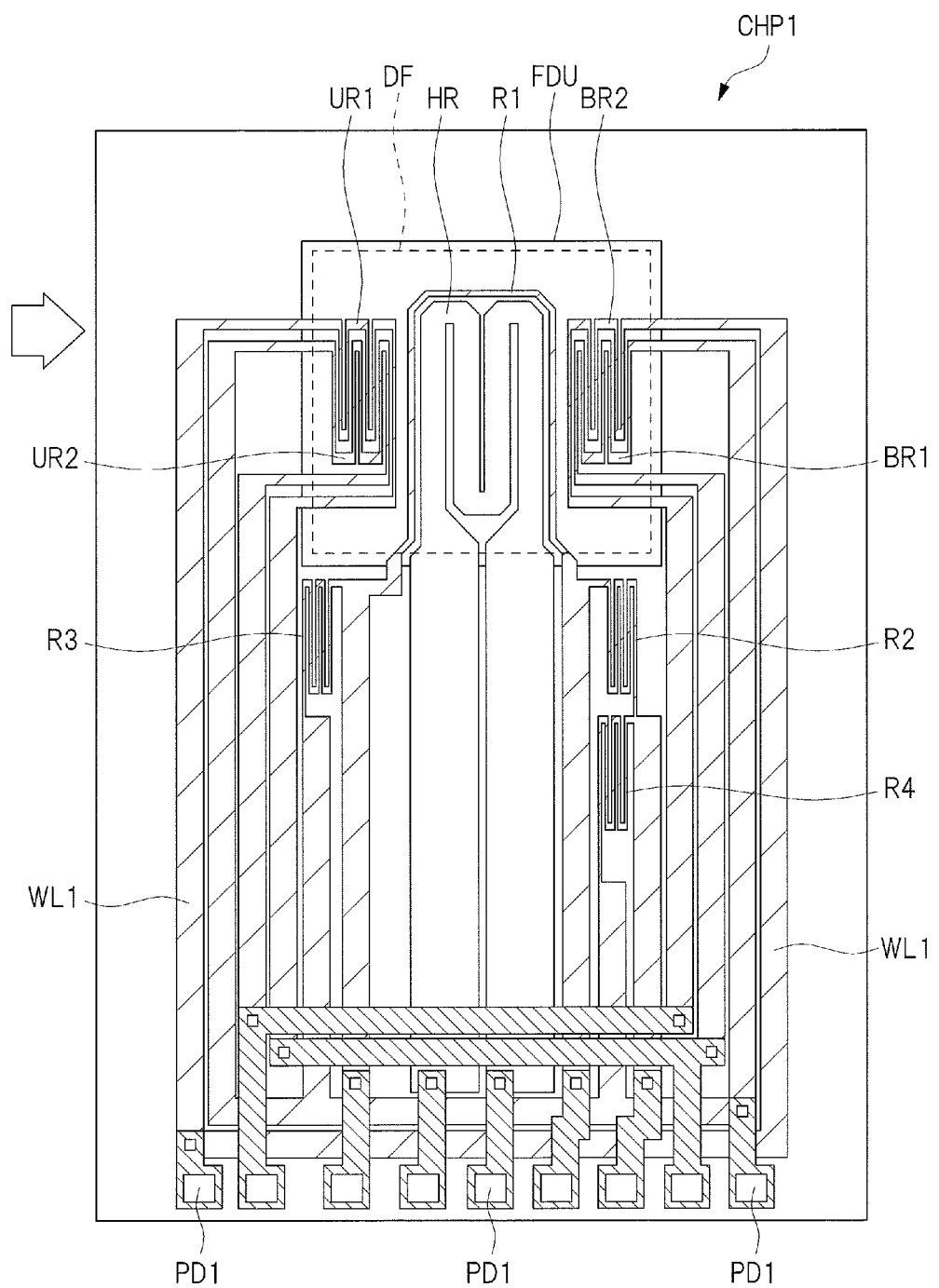
FIG. 2 is a plan view of a layout of a semiconductor chip making up a part of the flow sensor according to the first embodiment.

FIG. 2 is a plan view of a layout of a semiconductor chip CHP1 making up apart of the flow sensor according to the first embodiment. As shown in FIG. 2, the semiconductor chip CHP1 is rectangular, and a gas flows from the left to right of the semiconductor chip CHP1 (arrowed direction). Also as shown in FIG. 2, a rectangular diaphragm DF is formed on the back surface of the rectangular semiconductor chip CHP1. The diaphragm DF represents a thin plate area where the thickness of the semiconductor chip CHP1 is thinned. This means that the thickness of the semiconductor chip CHP1 is made thinner in the area where the diaphragm DF is formed than in the other area of the semiconductor chip CHP1.

In the surface area of semiconductor chip CHP1 that is counter to the back surface area where the diaphragm DF is formed, a flow detecting unit FDU is formed, as shown in FIG. 2. Specifically, in the center of the flow detecting unit FDU, the heating resistor HR is formed, and the heating resistor HR is surrounded by the resistor R1 making up the heater control bridge. Outside the flow detecting unit FDU, the resistors R2 to R4 making up the heater control bridge are formed. The heater control bridge is composed of the resistors R1 to R4 formed in this manner.

In particular, since the resistor R1 making up the heater control bridge is located close to the heating resistor HR, it is possible to allow the temperature of a gas heated by heat from the heating resistor HR to be reflected precisely on the resistor R1.

On the other hand, since the resistors R2 to R4 making up the heater control bridge are located distant from the heating resistor HR, it is possible to make the resistors R2 to R4 hardly susceptible to heat from the heating resistor HR.

Hence the resistor R1 may be configured to be sensitive to the temperature of the gas heated by the heating resistor HR while the resistors R2 to R4 are configured to be hardly affected by the heating resistor HR and readily keep their resistance values constant. This can improve the detection precision of the heater control bridge.

The upstream temperature-measuring resistors UR1 and UR2 and the downstream temperature-measuring resistors BR1 and BR2 are arranged such that the heating resistor HR formed on the flow detecting unit FDU is sandwiched between the upstream temperature-measuring resistors UR1 and UR2 and the downstream temperature-measuring resistors BR1 and BR2. Specifically, the upstream temperature-measuring resistors UR1 and UR2 are formed on the upstream-side of the arrowed direction of flow of the gas while the downstream temperature-measuring resistors BR1 and BR2 are formed on the downstream-side of the arrowed direction of flow of the gas.

In this configuration, when the gas flows in the arrowed direction, it is possible to drop the temperature of the upstream temperature-measuring resistors UR1 and UR2 and raise the temperature of the downstream temperature-measuring resistors BR1 and BR2. In this manner, the temperature sensor bridge is formed of the upstream temperature-measuring resistors UR1 and UR2 downstream temperature-measuring resistors BR1 and BR2 that are arranged in the flow detecting unit FDU.

The above-mentioned heating resistor HR, upstream temperature-measuring resistors UR1 and UR2, and downstream temperature-measuring resistors BR1 and BR2 can be fabricated by, for example, forming a metal film made of platinum, etc., or a semiconductor thin film made of polysilicon (polycrystal silicon), etc., by sputtering, CVD (Chemical Vapor Deposition), etc., and then patterning the formed film by ion etching, etc.

The heating resistor HR, the resistors R1 to R4 making up the heater control bridge, and the upstream temperature-measuring resistors UR1 and UR2 and downstream temperature-measuring resistors BR1 and BR2 making up the temperature sensor bridge that are configured in the above manner are connected to lines WL1 and are thus extensively connected to pads PD1 arranged along the lower side of the semiconductor chip CHP1.

The semiconductor chip CHP1 making up a part of the flow sensor of the first embodiment is laid out in the above manner. In an actual case, the flow sensor includes one semiconductor chip carrying the heating resistor HR, heater control bridge HCB, and temperature sensor bridge TSB, and the other semiconductor chip carrying the CPU 1, input circuit 2, output circuit 3, and memory 4. The flow sensor is structured such that these semiconductor chips are mounted on a substrate.

In the following description, a related technique for a mounting configuration of the flow sensor will first be explained and then a disadvantage to be improved included in the related technique will be explained. Further, a mounting configuration of the flow sensor of the first embodiment that provides a means for improving the disadvantage included in the related technique will also be explained.

<Explanation of Related Technique>

FIG. 3 depicts a mounting configuration of a flow sensor FSP according to a related technique, showing a configuration of the flow sensor FSP sealed with a resin. Specifically, FIG. 3(a) is a plan view of a mounting configuration of the flow sensor FSP according to the related technique. FIG. 3(b) is a sectional view of FIG. 3(a) taken along an A-A line, and FIG. 3(c) is a sectional view of FIG. 3(a) taken along a B-B line.

As shown in FIGS. 3(a) to 3(c), the flow sensor FSP according to the related technique includes the semiconductor chip CHP1 mounted on a chip mounting part TAB1, and the semiconductor chip CHP1 is bonded to the chip mounting part TAB1 with an adhesive ADH1. The flow detecting unit FDU is formed on the main surface (upper surface, surface) of the semiconductor chip CHP1, and the diaphragm (thin plate portion) DF is formed on the part of back surface of semiconductor chip CHP1 that is counter to the flow detecting unit FDU.

As shown in FIGS. 3(a) to 3(c), in the flow sensor FSP according to the related technique, a semiconductor chip CHP2 is sealed with a sealing body including a resin MR and a part of the semiconductor chip CHP1 as well as a part of the chip mounting part TAB1 are also sealed with the sealing body including the resin MR. Specifically, in the flow sensor FSP according to the related technique, a layer of the resin MR is formed such that the resin MR covers the side faces and apart of the upper surface of the semiconductor chip CHP1 while leaving the flow detecting unit FDU on the upper surface of the semiconductor chip CHP1 exposed. In addition, as shown in FIG. 3, on the part of surface of semiconductor chip CHP1 that is exposed from the resin MR, for example, an ID number NUM for identifying the semiconductor chip CHP1, such as "A001", is formed.

The flow sensor FSP according to the related technique having such a configuration is, for example, resin-sealed by a manufacturing process shown in FIG. 4. FIG. 4 is a sectional view showing a process of resin-sealing the flow sensor FSP according to the related technique.

As shown in FIG. 4, the semiconductor chip CHP1 is fixed on the chip mounting part TAB1 formed on a lead frame LF, using the adhesive ADH1. The lead frame LF on which the semiconductor chip CHP1 is mounted, is clamped between an upper mold UM and a lower mold BM via a second space. Subsequently, under a heated condition, the resin MR is lead into the second space to seal a part of the semiconductor chip CHP1 with the resin MR.

At this time, as shown in FIG. 4, because the internal space of the diaphragm DF is isolated from the second space by the adhesive ADH1, it is possible to prevent the resin MR from flowing into the internal space of the diaphragm DF when the second space is filled with the resin MR.

Further, the upper mold UM has a recession that is formed to secure a first space SP1 (closed space) surrounding the flow detecting unit FDU formed on the upper surface of the semiconductor chip CHP1. By this configuration, when the upper mold UM is pressed against the semiconductor chip CHP1, for example, the side faces and a part of the upper surface of the semiconductor chip CHP1 are sealed with the resin while the recession formed on the upper mold UM secures the first space SP1 (closed space) surrounding the flow detecting unit FDU formed on the semiconductor chip CHP1 and an area around the flow detecting unit FDU. That is, according to the related technique, a part of the semiconductor chip CHP1 is sealed with the resin while the flow detecting unit FDU formed the semiconductor chip CHP1 and the area around the flow detecting unit FDU are left exposed.

Specifically, FIG. 4 is a sectional view showing a process, i.e., manufacturing method by which as components including the semiconductor chip CHP1 mounted on the chip mounting part TAB1 of the lead frame LF are clamped between the lower mold BM and the upper mold UM with an elastic film LAF attached thereto, the resin MR is injected into the second space formed between the upper mold UM and the lower mold BM. FIG. 4 depicts, in particular, a sectional view of the flow sensor in the direction of flow of air (gas). As shown in FIG. 4, the semiconductor chip CHP1 is pressed down by the upper mold UM via the elastic film LAF and is therefore fixed by the upper mold UM.

In the related technique, since the semiconductor chip CHP1 carrying the flow detecting unit FDU can be resin-sealed as the semiconductor chip CHP1 is fixed by the molds, a part of the semiconductor chip CHP1 can be sealed with the resin MR while a positional shift of the semiconductor chip CHP1 is suppressed. This means that according to the manufacturing method for the flow sensor FSP of the related technique, a part of the semiconductor chip CHP1 can be sealed with the resin MR as a positional shift of each flow sensor is suppressed and that variation in the position of the flow detecting unit FDU formed on the semiconductor chip CHP1 can be suppressed. As a result, according to the related technique, since the position of the flow detecting unit FDU that detects the flow rate of a gas is made identical at each flow sensor, variation in the performance of each flow sensor in detection of a gas flow rate is suppressed. In other words, the related technique, by which a part of the semiconductor chip CHP1 is sealed with the resin as the semiconductor chip CHP1 is fixed by the molds, suppresses the performance variation of each flow sensor FSP more effectively than a technique using a potting resin.

In the manufacturing method for the flow sensor FSP including a resin-sealing process, it is required that the sealing body including the resin MR be parted smoothly from the lower mold MB. For this, a push-out pin (ejector pin) capable of vertical movement (which is not depicted in FIG. 4) is inserted in the lower mold MB, and using this push-out pin, the sealing body after resin-sealed is parted from the lower mold BM.

Hence, a mounting height defined as the distance from the lower end of the lead frame LF to the upper end of the semiconductor chip CHP1 before the resin-sealing process may vary. Variation in the mounting height is caused by the variation in the wall-thicknesses of components (lead frame LF, adhesive ADH1, semiconductor chip CHP1). To prevent the breakage of the semiconductor chip or resin leakage to the semiconductor chip CHP1 caused by the variation in the mounting height, for example, in the related technique, the elastic film. LAF is interposed between the semiconductor chip CHP1 and the upper mold UM, as shown in FIG. 4.

Thereby, for example, if the thickness of the semiconductor chip CHP1 is smaller than its average thickness, a gap is created when the lead frame LF carrying the semiconductor chip CHP1 is clamped between the upper mold UM and the lower mold BM. However, since this gap is filled with the elastic film LAF, resin leakage to the semiconductor chip CHP1 is prevented.

On the other hand, if the thickness of the semiconductor chip CHP1 is larger than its average thickness, when the lead frame LF carrying the semiconductor chip CHP1 is clamped between the upper mold UM and the lower mold BM, the elastic film LAF has an elastic modulus lower than that of the semiconductor chip CHP1, so that the size of the thickness of the elastic film LAF changes to absorb the thickness of the semiconductor chip CHP1. Thereby, if the thickness of the semiconductor chip CHP1 is larger than its average thickness, application of an unnecessarily large force to the semiconductor chip CHP1 is prevented, and as a result, the breakage of the semiconductor chip CHP1 is prevented.

That is, according to the manufacturing method for the flow sensor FSP of the related technique, the semiconductor chip CHP1 is pressed down by the upper mold UM via the elastic film LAF. Therefore, a change in the thickness of the elastic film LAF can absorb variation in component mounting caused by variation in the thicknesses of the semiconductor chip CHP1, adhesive ADH1, and lead frame LF. In this manner, according to the related technique, a clamping force applied to the semiconductor chip CHP1 can be reduced. This prevents damage to the semiconductor chip CHP1 including breaking, chipping, and cracking. In other words, according to the manufacturing method for the flow sensor FSP of the related technique, therefore, the semiconductor chip CHP1 is protected from damage thereto including breaking, chipping, and cracking that occur as a result of an increase in the clamping force caused by variation in component mounting.

<Disadvantage to be Improved Included in Related Technique>

As for the exposed part of semiconductor chip CHP1 that is not covered with the resin MR, the exposed part including the flow detecting unit FDU and the area around it, a silicon material, which is the main constituent of the semiconductor chip CHP1, is exposed. The silicon material is brittle and is therefore broken easily by an external load, such as thermal stress created by impact, temperature change, etc. It is therefore necessary to reduce the size of the exposed part of the semiconductor chip CHP1 including the flow detecting unit FDU and the area around it as much as possible.

However, as shown in FIG. 4, to prevent the resin MR from flowing in toward the flow detecting unit FDU, the size of a contact part SEL where the elastic film LAF and the semiconductor chip CHP1 are in contact must be equal to or larger than a given size for ensuring sealing performance high enough to prevent resin leakage to the flow detecting unit FDU. Therefore, reducing the size (width) of the contact part SEL in order to reduce the size of the exposed area of the semiconductor chip CHP1 is difficult. That is, although the contact part SEL ultimately constitutes a part where the surface of the semiconductor chip CHP1 is exposed, the size of the contact part SEL cannot be reduced in order to reduce the size of the exposed area of the semiconductor chip CHP1. This is because that reducing the size of the contact part SEL where the elastic film LAF and the semiconductor chip CHP1 are in contact brings difficulty in ensuring the sufficient sealing performance that prevents resin leakage to the flow detecting unit FDU.

Then, to reduce the size of the exposed part of semiconductor chip CHP1 that is not covered with the resin MR, the exposed part including the flow detecting unit FDU and the area around it, reducing the size SL of the first space (closed space) SP1 surrounding the flow detecting unit FDU formed on the upper surface of the semiconductor chip CHP1 is to be considered. In this case, since the size SL of the first space SP1 itself is reduced without reducing the size of the contact part SEL where the elastic film LAF and the semiconductor chip CHP1 are in contact, as a result, a reduction in the exposed part (exposed area) of the semiconductor chip CHP1 is possible.

On the other hand, as shown in FIG. 4, the diaphragm DF is formed on the back surface of the semiconductor chip CHP1. To form the diaphragm DF on the back surface of the semiconductor chip CHP1, the semiconductor chip CHP1 must be processed to form a thin plate. Generally, the diaphragm DF is formed by processing a single crystal silicon with [100] plane orientation used for the semiconductor chip CHP1 into a sloped shape with an angle of 54.7 degrees by potassium hydroxide (KOH) etching.

FIG. 5 is a sectional view showing a process by which the flow sensor FSP according to the related technique with the first space SP1 reduced in size is resin-sealed. As shown in FIG. 5, when the size SL of the first space SP1 is reduced, the sloped part of the diaphragm DF is located in an area underneath the contact part SEL where the elastic film LAF and the semiconductor chip CHP1 are in contact. In this case, because the load of the contact part SEL is applied directly to the sloped part of the diaphragm DF, a crack CLK is apt to develop on the semiconductor chip CHP1. This leads to a fact that adopting the configuration for reducing the size of the exposed part of the semiconductor chip CHP1 according to the related technique produces a side effect that the crack CLK is apt to develop on the semiconductor chip CHP1, which is a disadvantage to be improved.

As in the case of forming the diaphragm DF by etching, in a case of forming the diaphragm DF into a square slot by sand-blasting, etc., the size SL of the first space SP1 must be reduced in order to reduce the size of the exposed part of the semiconductor chip CHP1 as much as possible. From this, the distance between the contact part SEL where the elastic film LAF and the semiconductor chip CHP1 are in contact and the diaphragm DF becomes shorter, which result in that the crack CLK is apt to develop on the semiconductor chip CHP1.

Further, for example, as shown in FIG. 3, the ID number NUM representing a lot number, etc., (e.g., "A001" in FIG. 3) is formed on the semiconductor chip CHP1, and is used for product management etc. When the exposed part of the upper surface of the semiconductor chip CHP1 becomes smaller, therefore, the ID number NUM on the semiconductor chip CHP1 is covered with the resin MR, in which case the ID number NUM may become unrecognizable.

Therefore, a technical concept of a first embodiment provides a means for improving the above disadvantage. The technical concept of the first embodiment providing the means for improving the disadvantage will hereinafter be described.

<Structure of Flow Sensor of First Embodiment not Sealed with Resin Yet>

FIG. 6 depicts a mounting configuration of a flow sensor FS1 according to the first embodiment, showing a configuration of the flow sensor FS1 not sealed with a resin yet. FIG. 6(a) is a plan view of a mounting configuration of the flow sensor FS1 according to the first embodiment. FIG. 6(b) is a sectional view of FIG. 6(a) taken along an A-A line. And FIG. 6(c) is a plan view of the back surface of the semiconductor chip.

At first, as shown in FIG. 6(a), the flow sensor FS1 of the first embodiment includes, for example, the lead frame LF made of a copper material. This lead frame LF has a chip mounting part TAB1 and a chip mounting part TAB2 that are disposed in the lead frame interior enclosed with a dam bar DM making up an outer frame. A semiconductor chip CHP1 is mounted on the chip mounting part TAB1, and a semiconductor chip CHP2 is mounted on the chip mounting part TAB2.

The semiconductor chip CHP1 is rectangular in shape and has the flow detecting unit FDU formed almost at its center. Lines WL1 connected to the flow detecting unit FDU are formed on the semiconductor chip CHP1, where the lines WL1 are connected to a plurality of pads PD1 formed along one side of the semiconductor chip CHP1. In other words, the detecting unit FDU is connected to the plurality of pads PD1 via the lines WL1. The pads PD1 are connected to leads LD1 formed on the lead frame LF via wires W1 made of, for example, gold wires. The leads LD1 formed on the lead frame LF are then connected to pads PD2 formed on the semiconductor chip CHP2 via wires W2 made of, for example, gold wires.

On the semiconductor chip CHP2, integrated circuits composed of semiconductor elements, such as MISFETs (Metal Insulator Semiconductor Field-Effect Transistor), and lines are formed. Specifically, integrated circuits making up the CPU1, input circuit 2, output circuit 3, memory 4, etc., shown in FIG. 1 are formed on the semiconductor chip CHP2. These integrated circuits are connected to pads PD2 and PD3 functioning as external connection terminals. The pads PD3 formed on the semiconductor chip CHP2 are connected to the leads LD2 formed on the lead frame LF via wires W3 made of, for example, gold wires. In this manner, the semiconductor chip CHP1 on which the flow detecting unit FDU is formed and the semiconductor chip CHP2 on which a control circuit is formed, are connected via the leads LD1 formed on the lead frame LF.

Here, although not shown in Figs., the outermost layer (surface) of the semiconductor chip CHP1 may be coated with a polyimide film (not depicted) for the purpose of easing a stress, protecting the surface, and providing insulation when the semiconductor chip CHP1 is bonded to the resin.

The dam bar DM shown in FIG. 6(a) has a function of preventing resin leakage during a resin-sealing process, which will be described later, and the dam bar DM is cut away after the resin-sealing process.

Subsequently, as shown in FIG. 6(b), the lead frame LF has the chip mounting part TAB1, on which the semiconductor chip CHP1 is mounted. The semiconductor chip CHP1 is bonded to the chip mounting part TAB1 with the adhesive ADH1. On the back surface of the semiconductor chip CHP1, the diaphragm DF (thin plate portion) is formed.

On the part of surface of semiconductor chip CHP1 that is counter to the diaphragm DF, the flow detecting unit FDU is formed.

On the other hand, at the bottom of the chip mounting part TAB1 under the diaphragm DF, an opening OP1 is formed. A configuration in which the opening OP1 is formed on the bottom of the chip mounting part TAB1 under the diaphragm DF is described in this example, but the technical concept of the first embodiment is not limited to this configuration, and a lead frame LF not having the opening OP1 may also be used.

Further, as shown in FIG. 6(b), not only the flow detecting unit FDU but also the pads PD1 connected thereto are formed on the (upper) surface of the semiconductor chip CHP1, where the pads PD1 are connected to the leads LD1 formed on the lead frame LF, via the wires W1. And, not only the semiconductor chip CHP1 but also the semiconductor chip CHP2 is mounted on the lead frame LF, where the semiconductor chip CHP2 is bonded to the chip mounting part TAB2 with the adhesive ADH1.

Further, the pads PD2 formed on the semiconductor chip CHP2 are connected to the leads LD1 formed on the lead frame LF, via the wires W2. The pads PD3 formed on the semiconductor chip CHP2 and the leads LD2 formed on the lead frame LF are electrically connected via the wires W3.

In addition, the pads PD1 of the first semiconductor chip CHP1 and the pads PD2 of the first semiconductor chip CHP2 may be connected directly via gold wires.

AS the adhesive ADH1 connecting the semiconductor chip CHP1 to the chip mounting part TAB1 and the adhesive ADH1 connecting the semiconductor chip CHP2 to the chip mounting part TAB2, for example, an adhesive made of a thermosetting resin, such as epoxy resin and polyurethane resin, or an adhesive made of a thermoplastic resin, such as polyimide resin, acrylic resin, and fluoro resin may be used.

The adhesive made mainly of the thermosetting resin or thermoplastic resin may be given conductivity and have its linear expansion coefficient controlled, by adding a metal material, such as gold, silver, copper, and tin, and an inorganic material containing silica, glass, carbon, mica, talc, etc., to the adhesive.

Here, the adhesion between the semiconductor chip CHP1 and the chip mounting part TAB1 may be made via a coating of the adhesive ADH1 or a sheet of adhesive. For example, as shown in FIG. 6(c), a sheet of the adhesive ADH1 is pasted on the back surface of the semiconductor chip CHP1. The form of the adhesive ADH1 is not limited to this, for example, a sheet of the adhesive ADH1 to be applied may be processed into an arbitrary shape of square, circular, ellipse, etc., that surrounds the diaphragm DF, or adhesive may be coated.

<Structure of Flow Sensor of First Embodiment Sealed with Resin>

Subsequently, amounting configuration of the flow sensor FS1 in the first embodiment after resin-sealed will be described.

FIG. 7 depicts a mounting configuration of the flow sensor FS1 of the first embodiment sealed with a resin, showing a configuration of the flow sensor FS1 sealed with the resin. FIG. 7(a) is a plan view of a mounting configuration of the flow sensor FS1 according to the first embodiment. FIG. 7(b) is a sectional view taken along an A-A line in FIG. 7(a), and FIG. 7(c) is a sectional view taken along a B-B line in FIG. 7(a).

As shown in FIG. 7(a), the flow sensor FS1 of the first embodiment is structured such that a part of the semiconductor chip CHP1 and the whole of the semiconductor chip CHP2 are covered with the resin MR with the condition in which the flow detecting unit FDU formed on the semiconductor chip CHP1 is exposed. That is, in the first embodiment, a pad forming area of the semiconductor chip CHP1 and the whole area of the semiconductor chip CHP2 are collectively sealed with the resin MR while an area where the flow detecting unit FDU is formed is exposed.

According to the first embodiment, for example, a projection composed of the resin MR may be formed such that the projection covers the wires W1 electrically connected to the pads PD formed on the semiconductor chip CHP1. That is, a projection may be formed on the rein MR (sealing body) so that such a component as gold wires (wires) with a high loop height is certainly sealed with the rein MR. However, as indicated in FIGS. 7(a) and 7(b), such a projection is not an essential constituent element in the first embodiment. If the gold wires electrically connecting the pads PD1 formed on the semiconductor chip CHP1 to the leads LD1 can be sealed with the resin MR without forming the projection, forming the projection of the rein MR (sealing body) is unnecessary.

As the resin MR, for example, a thermosetting resin, such as epoxy resin and phenol resin, or a thermoplastic resin, such as polycarbonate, polyethylene terephthalate, polyphenylene sulfide, and polybutylene terephthalate may be used. The resin MR may be given conductivity and have its linear expansion coefficient controlled, by adding a metal material, such as gold, silver, copper, and tin, and an inorganic material containing silica, glass, carbon, mica, talc, etc., to the resin MR.

According to the first embodiment, sealing with the resin MR can be performed as the semiconductor chip CHP1 carrying the flow detecting unit FDU is fixed by the molds. Apart of the semiconductor chip CHP1 and the whole of the semiconductor chip CHP2, therefore, can be sealed with the resin MR while a positional shift of the semiconductor chip CHP1 is suppressed. This means that according to the flow sensor FS1 of the first embodiment, a part of the semiconductor chip CHP1 and the whole area of the semiconductor chip CHP2 can be sealed with the resin MR ehile a positional shift of each flow sensor FS1 is suppressed and that variation in the position of the flow detecting unit FDU formed on the semiconductor chip CHP1 can be suppressed.

Hence, according to the first embodiment, since the position of the flow detecting unit FDU that detects the flow rate of a gas is determined to be identical at each flow sensor FS1, a remarkable effect that variation in the performance of each flow sensor FS1 in detection of a gas flow rate is suppressed can be obtained.

The first embodiment includes a prerequisite that to prevent the resin MR from flowing into the internal space of the diaphragm DF, for example, the adhesive AHD1 be so applied as to encircle the diaphragm DF formed on the back surface of the semiconductor chip CHP1. As shown in FIGS. 7(b) and 7(c), the opening OP1 is formed at the bottom of the chip mounting part TAB1 under the diaphragm DF formed on the back surface of the semiconductor chip CHP1, and an opening OP2 is formed in the resin MR covering the back surface of the chip mounting part TAB1.

Thereby, according to the flow sensor FS1 of the first embodiment, the internal space of the diaphragm DF communicates with an external space outside the flow sensor FS1 via the opening OP1 formed at the bottom of the chip mounting part TAB1 and the opening OP2 formed in the resin MR. As a result, the pressure of the internal space of the diaphragm DF and the pressure of the external space outside the flow sensor FS1 are made equal with each other, thus suppressing stress application to the diaphragm DF.

<Feature of First Embodiment>

The feature of the first embodiment is that in the area of semiconductor chip CHP1 that is exposed from the resin MR, a resin MR2 is formed in an area other than the flow detecting unit FDU and the area around it. According to the first embodiment, therefore, an area of semiconductor chip CHP1 that is exposed from the resins MR and MR2 can be reduced in size. In other words, according to the first embodiment, the area where the silicon material, which is the main constituent of the semiconductor chip CHP1, is exposed can be reduced in size. This prevents a case where the semiconductor chip CHP1 is broken by an external load, such as heat stress cause by impact and temperature changes.

Further, according to the first embodiment, in the surface area of the semiconductor chip CHP1, an area covered with the resin MR or MR2 can be increased in size. As a result, an area of contact between the semiconductor chip CHP1 and the resin MR or MR2 becomes large, and this prevents separation of the resin MR from the semiconductor chip CHP1 or the resin MR2 from the semiconductor chip CHP1. Therefore, the flow sensor FS1 of the first embodiment can offer improved reliability.

At this time, in the flow sensor FS1 of the first embodiment, the resin MR and the resin MR2 are different in constituent from each other. Both of the resins MR and MR2 include, for example, a resin, such as epoxy resin, a filler made of silica, glass, carbon, mica, talc, etc., and a coloring material. However, the volume of the filler and coloring material included in the resin MR is different from the volume of the filler and coloring material included in the resin MR2. More specifically, the volume of the filler and coloring material included in the resin MR2 is smaller than the volume of the filler and coloring material included in the resin MR. This results because of adoption of a manufacturing method for the flow sensor FS1 of the first embodiment, which will be described in detail later in the item of the manufacturing method.

As described above, in the flow sensor FS1 of the first embodiment, because the volume of the filler and coloring material included in the resin MR2 is smaller than the volume of the filler and coloring material included in the resin MR, the resin MR2 is, for example, transparent. For this reason, even if an area covered with the resin MR2 is present in the surface area of the semiconductor chip CHP1, the ID number NUM formed on the semiconductor chip CHP1 can be recognized.

In the first embodiment, the term "transparent" means a property of transmitting visible light, for example, representing a broader concept including a state of generation of transmitted light. In this specification, therefore, a state of generation of transmitted light is defined as "transparent", regardless of the quantity of transmitted light. Accordingly, not only the state where the quantity of transmitted light is large but also a "translucent" state where the quantity of transmitted light is about half of that in the transparent state and a state where the quantity of transmitted light is small are considered to be "transparent", which, in this specification, is defined as a state where transmitted light is present and is included in the concept of "transparent". In addition, in this specification, "visible light" refers to an electromagnetic wave with a wavelength ranging from 400 nm to 760 nm.

In the first embodiment, for example, in the surface area of semiconductor chip CHP1 that is exposed from the resin MR, the resin MR2 is formed in the area other than the flow detecting unit FDU and the area around it, as shown in FIG. 7(a). In other words, in the surface area of the semiconductor chip CHP1, the resin MR2 is formed in an inside area to resin MR that is not covered with the resin MR. That is, in the first embodiment, the resin MR2 is formed at least on a part of the surface area of the semiconductor chip CHP1. In particular, as shown in FIG. 7(a), in the surface area of the semiconductor chip CHP1, the area covered with the resin MR is referred to as a first area, while the area located inside to the first area in a plan view is referred to as second area. It can be said, therefore, that in the surface area of the semiconductor chip CHP1, the resin MR2 is formed in the second area located inside to the first area in a plan view.

It is preferable in this case that the resin MR2 formed in the above second area be transparent, because the ID number NUM for identifying the semiconductor chip CHP1 may be formed in the second area located inside to the first area of the semiconductor chip CHP1. For example, if the resin MR2 not transparent is formed in the second area, the non-transparent resin MR2 covers the ID number NUM, in which case the ID number NUM formed on semiconductor chip CHP1 becomes unrecognizable. On the other hand, when the transparent resin MR2 is formed in the second area, the ID number NUM remains recognizable even if it is covered with the resin MR2. Hence the ID number NUM formed in the second area of the semiconductor chip CHP1 can be used effectively for product management, etc.

As described above, according to the technical concept of the first embodiment, the resin MR2 formed in the second area should preferably be transparent. However, the technical concept of the first embodiment is applied not only to the case of forming the transparent resin MR2 in the second area but also to the case of forming the non-transparent resin MR2 in the second area. Also in this case, the resin-covered area of the semiconductor chip CHP1 is increased in size as in the case of forming the transparent resin MR2, which prevents the breakage of the semiconductor chip CHP1 that occurs when the silicon material, which is the main constituent of the semiconductor chip CHP1, is exposed and is subjected to an external load, such as heat stress, created by impact and temperature changes. In addition, since the area of contact between the semiconductor chip CHP1 and the resin MR becomes large as in the case of forming the transparent resin MR2, it is possible to improve the adhesion quality of the semiconductor chip CHP1 and resin MR. These effects can be achieved regardless of whether the resin MR2 is transparent or not.

Furthermore, the above effects are achieved even when the resins MR and MR2 are composed of the same constituent. According to the technical concept of the first embodiment, however, the constituent of the resin MR2 formed in the second area is different from the constituent of the resin MR formed in the first area. Specifically, the volume of the filler and coloring material included in the resin MR2 is smaller than the volume of the filler and coloring material included in the resin MR.

For example, the resins MR and MR2 being composed of the same constituent means covering not only the first area but also the second area with the same resin MR, which is equivalent to application of the manufacturing method for the flow sensor according to the related technique. However, as described above, in the manufacturing method for the flow sensor according to the related technique, there is a disadvantage to be improved that reducing the exposed area of the semiconductor chip CHP1 produces the side effect that a crack is apt to develop on the semiconductor chip CHP1.

Therefore, the first embodiment provides a means for improving the disadvantage included in the related technique. As a result, in the first embodiment, a manufacturing method for the flow sensor different from the manufacturing method for the flow sensor according to the related technique is adopted, and by adopting this manufacturing method of the first embodiment, the constituent of the resin MR2 formed in the second area is differentiated from the constituent of the resin MR formed in the first area. Therefore, it can be said that although the technical concept of the first embodiment is not relevant to whether the resin MR2 is transparent or not, at least the sealing body must be composed of the resin MR including the first constituent and the resin MR2 including the second constituent different from the first constituent. The manufacturing method for the flow sensor FS1 according to the first embodiment will hereinafter be described referring to drawings.

<Manufacturing Method for Flow Sensor According to First Embodiment>

The manufacturing method will first be described from a viewpoint of clarifying a characteristic process of the first embodiment, referring to sectional views taken along a B-B line of FIG. 7(a) (FIGS. 8 to 13). The manufacturing method will then be described from a viewpoint of clarifying the fact that the flow sensor FS1 of the first embodiment is of a double-chip structure having the semiconductor chip CHP1 and the semiconductor chip CHP2 (FIGS. 14 to 18).

As shown in FIG. 8, for example, the lead frame LF made of a copper material is prepared. The lead frame LF has the chip mounting part TAB1, on the bottom of which the opening OP1 is formed.

Subsequently, as shown in FIG. 9, the adhesive ADH1 is formed on the chip mounting part TAB1. The adhesive ADH1 is provided as, for example, an adhesive made of a thermosetting resin, such as epoxy resin and polyurethane resin, or as an adhesive made of a thermoplastic resin, such as polyimide resin, acrylic resin, and fluoro resin. The adhesive ADH1 made mainly of the thermosetting resin or thermoplastic resin may be given conductivity and have its linear expansion coefficient controlled, by adding a metal material, such as gold, silver, copper, and tin, and an inorganic material containing silica, glass, carbon, mica, talc, etc., to the adhesive ADH1.

Subsequently, as shown in FIG. 10, the semiconductor chip CHP1 is mounted on the chip mounting part TAB1. Specifically, the semiconductor chip CHP1 is connected from above to the chip mounting part TAB1 formed on the lead frame LF, using the adhesive ADH1.

In addition, on the semiconductor chip CHP1, the flow detecting unit FDU, lines (not depicted), and pads (not depicted) are formed by an ordinary semiconductor manufacturing process. The diaphragm DF is then formed on the part of back surface of semiconductor chip CHP1 that is counter to the flow detecting unit FDU formed on the upper surface of the semiconductor chip CHP1 by, for example, anisotropic etching. For example, the diaphragm DF is formed by processing a single crystal silicon with [100] plane orientation used for the semiconductor chip CHP1 into a sloped shape with an angle of 54.7 degrees by potassium hydroxide (KOH) etching.

Subsequently, although not shown in Figs., the pads formed on the semiconductor chip CHP1 and leads formed on the lead frame LF are connected via wires (wire bonding). These wires are made of, for example, gold wires.

A part of the semiconductor chip CHP1 is then sealed with the resin MR (molding process). In other words, a part of the semiconductor chip CHP1 is sealed with the sealing body as the flow detecting unit FDU formed on the semiconductor chip CHP1 is left exposed.

Specifically, as shown in FIG. 11, the upper mold UM with the elastic film LAF attached to its bottom and the lower mold BM are prepared. Then, the lead frame LF carrying the semiconductor chip CHP1 is clamped between the upper mold UM and the lower mold BM via the second space SP2 while a part of the upper mold UM is stuck closely to the upper surface of the semiconductor chip CHP1 via the elastic film LAF to form the first space SP1 surrounding the flow detecting unit FDU between the upper mold UM and the semiconductor chip CHP1.

At this time, in the first embodiment, as shown in FIG. 11, the size SL of the first space SP1 turns out to be larger than the size of the diaphragm DF, in which the upper mold UM with the elastic film LAF attached thereto is disposed such that the diaphragm DF is enclosed in the first space SP1 in a plan view. In other words, the upper mold UM is disposed such that the contact part SEL where the elastic film LAF and the semiconductor chip CHP1 are in contact does not overlap the diaphragm DF in a plan view. As a result, according to the first embodiment, the thin diaphragm DF is not disposed in the area underneath the contact part SEL where the elastic film LAF and the semiconductor chip CHP1 are in contact. Therefore, since it is possible to prevent a pressure to the upper mold UM from being applied directly to the thin diaphragm DF via the contact part SEL where the elastic film LAF and the semiconductor chip CHP1 are in contact, damage to the semiconductor chip CHP1 can be suppressed.

Subsequently, as shown in FIG. 12, under a heated condition, the resin MR is lead into the second space by a plunger. The resin MR includes, for example, the resin, such as epoxy resin, the filler made of silica, glass, carbon, mica, talc, etc., and the coloring material.

A feature of the first embodiment is that a pressure of injection of the resin MR into the second space creates a gap on the contact part SEL where the elastic film LAF and the semiconductor chip CHP1 are in contact, and the resin MR2 different in constituent from the resin MR infiltrates into the gap. In other words, in the first embodiment, a pressure applied from the upper mold UM to the semiconductor chip CHP1 via the elastic film LAF is weakened. Specifically, the pressure to the upper mold UM is weakened to the extent that the pressure of injection of the resin MR deforms the elastic film LAF and creates a gap on the contact part SEL where the elastic film LAF and the semiconductor chip CHP1 are in contact. In this manner, according to the first embodiment, since the downward pressure from the upper mold UM that is exerted onto the semiconductor chip CHP1 via the elastic film LAF is weakened, an effect of preventing damage to the semiconductor chip CHP1 can also be improved.

As described above, in the first embodiment, the pressure of injection of the resin MR into the second space creates a gap on the contact part SEL where the elastic film LAF and the semiconductor chip CHP1 are in contact, and the resin MR2 infiltrates into the gap. The MR2 infiltrating into the gap of the contact part SEL is different in constituent from the resin MR. A mechanism that makes the resin MR and the resin MR2 different in constituent from each other will be described.

FIG. 13 is an enlarged view of a state in which a gap is formed on the contact part SEL where the elastic film LAF and the semiconductor chip CHP1 are in contact by the pressure of injection of the resin MR into the second space.

In FIG. 13, the pressure of injection of the resin MR deforms the elastic film LAF on the contact part SEL where the elastic film LAF and the semiconductor chip CHP1 are in contact, thereby a gap is created in the contact part SEL. At this time, the gap is roughly as large as the deformed part of elastic film LAF that is created by the injection pressure. Meanwhile, a coloring material CLS, filler FUL, etc., making up the resin MR usually aggregate, thus existing in clustered state in the resin MR. For this reason, only the transparent resin constituent, such as epoxy resin EP, is able to flow into the gap between the elastic film LAF and the semiconductor chip CHP1 as the coloring material CLS and filler FUL in their clustered state hardly manage to flow into the gap. For example, the size of the gap formed on the contact part SEL where the elastic film LAF and the semiconductor chip CHP1 are in contact is about several μm while the particle size of the coloring material CLS and filler FUL in their clustered state is several ten μm. As a result, the coloring material CLS and filler FUL in their clustered state hardly manage to flow into the gap.

As a result, according to the first embodiment, the constituent of the resin MR2 infiltrating into the gap between elastic film LAF and the semiconductor chip CHP1 turns out to be different from the constituent of the resin MR. Specifically, the volume of the coloring material CLS and filler FUL included in the resin MR2 is smaller than the volume of the coloring material CLS and filler FUL included in the resin MR. Therefore, since the resin MR2 having infiltrated into the gap between elastic film LAF and the semiconductor chip CHP1 contains less volume of coloring material CLS and filler FUL, the resin MR2 becomes transparent to, for example, visible light.

In addition, in the first embodiment, although a gap is formed on the contact part SEL where the elastic film LAF and the semiconductor chip CHP1 are in contact, and the resin MR2 is caused to infiltrate into the gap, it is thought this method brings a concern that the infiltrating resin MR2 may leak into the first space SP1 enclosing the flow detecting unit FDU therein. Relating to this, in the first embodiment, however, the gap formed on the contact part SEL where the elastic film LAF and the semiconductor chip CHP1 are in contact is extremely small, because of which a possibility that the resin MR2 having infiltrating into the gap leaks into the first space SP1 enclosing the flow detecting unit FDU therein is extremely low. In particular, an examination made by the inverter has verified that when a gap is actually formed on the contact part SEL where the elastic film LAF and the semiconductor chip CHP1 are in contact, and the resin MR2 is caused to infiltrate into the gap, the resin MR2 never reaches the flow detecting unit FDU.

Subsequently, at the stage that the resins MR and MR2 have cured, the lead frame LF carrying the semiconductor chip CHP1 is removed from the upper mold UM and the lower mold BM. Specifically, the upper mold UM is removed first from the sealing body including the resin MR and then the sealing body sealing a part of the semiconductor chip CHP1 is parted from the lower mold BM, for example, by pushing out the sealing body with the push-out pin. In the above manner, the flow sensor FS1 in which a part of the semiconductor chip CHP1 is sealed with the sealing body composed of the resins MR and MR2 different in constituent from each other can be manufactured.

In a resin-sealing process (molding process) according to the first embodiment, the upper mold UM and lower mold BM heated to a high temperature of 80° C. or higher are used. Therefore, the heated upper mold UM and lower mold BM quickly transmit heat to the resin MR injected in the second space. As a result, according to the manufacturing method for the flow sensor FS1 of the first embodiment, a time for heating/curing the resin MR is reduced.

For example, as described above in the paragraphs of PROBLEMS TO BE SOLVED BY THE INVENTION, when gold wires are fixed with a potting resin, the potting resin takes a long time to cure because it is not subjected to heat treatment that accelerate its curing. This leads to a problem of a drop in throughput in the manufacturing process for the flow sensor.

On the contrary, in the resin-sealing process according to the first embodiment, as described above, the heated upper mold UM and lower mold BM are used. This allows quick heat transfer from the heated upper mold UM and lower mold BM to the resin MR, thus reducing the time for heating/curing the resin MR. Hence, according to the first embodiment, throughput in the manufacturing process for the flow sensor FS1 can be improved.

Subsequently, the manufacturing method for the flow sensor FS1 according to the first embodiment will then be described from a viewpoint of clarifying the fact that the flow sensor FS1 of the first embodiment is of the double-chip structure having the semiconductor chip CHP1 and the semiconductor chip CHP2 (FIGS. 14 to 18).

At first, as shown in FIG. 14, for example, the lead frame LF made of a copper material is prepared. The lead frame LF has the chip mounting part TAB1, chip mounting part TAB2, leads LD1, and leads LD2 that are formed integrally, and also has the opening OP1 formed on the bottom of the chip mounting part TAB1.

Next, as shown in FIG. 15, the adhesive ADH1 is formed on the chip mounting part TAB1 and on the chip mounting part TAB2. Then, as shown in FIG. 16, the semiconductor chip CHP1 is mounted on the chip mounting part TAB1 while the semiconductor chip CHP2 is mounted on the chip mounting part TAB2. Specifically, the semiconductor chip CHP1 is connected from above to the chip mounting part TAB1 formed in the lead frame LF, using the adhesive ADH1. At this time, the semiconductor chip CHP1 is mounted the chip mounting part TAB1 such that the diaphragm DF formed the semiconductor chip CHP1 communicates with the opening OP1 formed on the bottom of the chip mounting part TAB1.

On the semiconductor chip CHP1, the flow detecting unit FDU, lines (not depicted), and pads PD1 are formed by an ordinary semiconductor manufacturing process. The diaphragm DF is formed on the part of back surface of semiconductor chip CHP1 that is counter to the flow detecting unit FDU formed on the upper surface of the semiconductor chip CHP1 by, for example, anisotropic etching. On the chip mounting part TAB2 formed on the lead frame LF, the semiconductor chip CHP2 is mounted via the adhesive ADH1. On the semiconductor chip CHP2, such semiconductor elements as MISFETs (not depicted), lines (not depicted), and the pads PD2 and PD3 are formed in advance by an ordinary semiconductor manufacturing process.

Subsequently, as shown in FIG. 17, the pads PD1 formed on the semiconductor chip CHP1 are connected to the leads LD1 formed on the lead frame LF via the wires W1 (wire bonding). In the same manner, the pads PD2 formed on the semiconductor chip CHP2 are connected to the leads LD1 via the wires W2 and the pads PD3 formed on the semiconductor chip CHP2 are connected to the leads LD2 via the wires W3. These wires W1 to W3 are made of, for example, gold wires.

Subsequently, as shown in FIG. 18, the part of surface of semiconductor chip CHP1 other than the flow detecting unit FDU and the area around it, the wires W1, the leads D1, the wires W2, the entire main surface of the semiconductor chip CHP2, the wires 3, and a part of the leads LD2 are sealed with the resin MR (molding process).

Specifically, the lead frame LF carrying the semiconductor chips CHP1 and CHP2 is clamped between the upper mold UM and the lower mold BM via the second space while a part of the upper mold UM is contacted closely to the upper surface of the semiconductor chip CHP1 to form the first space SP1 surrounding the flow detecting unit FDU between the upper mold UM and the semiconductor chip CHP1. In other words, as shown in FIG. 18, the lead frame LF carrying the semiconductor chips CHP1 and CHP2 is clamped between the upper mold UM and the lower mold BM via the second space (closed space). Subsequently, under a heated condition, the resin MR is lead into the second space (closed space) to seal the part of surface of semiconductor chip CHP1 other than the flow detecting unit FDU and the area around it, the wires W1, the leads D1, the wires W2, the entire main surface of the semiconductor chip CHP2, the wires 3, and a part of the leads LD2, with the resin MR.

At this time, in the first embodiment, the pressure of injection of the resin MR into the second space creates a gap on the contact part where the elastic film LAF and the semiconductor chip CHP1 are in contact, and the resin MR2 different in constituent from the resin MR infiltrates into the gap. This means that in the first embodiment, the pressure applied from the upper mold UM to the semiconductor chip CHP1 via the elastic film LAF is weakened. Specifically, the pressure to the upper mold UM is weakened to the extent that the pressure of injection of the resin MR deforms the elastic film LAF and creates a gap on the contact part where the elastic film LAF and the semiconductor chip CHP1 are in contact.

The gap is roughly as large as the deformed part of elastic film LAF that is created by the injection pressure. Meanwhile, the coloring material, filler, etc., making up the resin MR usually aggregate, thus existing in clustered state in the resin MR. For this reason, only the transparent resin constituent, such as epoxy resin, is able to flow into the gap between the elastic film LAF and the semiconductor chip CHP1 as the coloring material and filler in their clustered state hardly manage to flow into the gap.

As a result, according to the first embodiment, the constituent of the resin MR2 infiltrating into the gap between elastic film LAF and the semiconductor chip CHP1 turns out to be different from the constituent of the resin MR. Specifically, the volume of the coloring material and filler included in the resin MR2 is smaller than the volume of the coloring material and filler included in the resin MR. Therefore, since the resin MR2 having infiltrated into the gap between elastic film LAF and the semiconductor chip CHP1 contains less volume of coloring material and filler, the resin MR becomes transparent to, for example, visible light.

In addition, in the first embodiment, for example, as shown in FIG. 18, since the internal space of the diaphragm DF is isolated from the second space by the adhesive ADH1, when the second space is filled with the resin MR, the resin MR is prevented from flowing into the internal space of the diaphragm DF.

Further, in the first embodiment, since resin-sealing can be performed as the semiconductor chip CHP1 carrying the flow detecting unit FDU is fixed by the molds, a part of the semiconductor chip CHP1 and the whole of the semiconductor chip CHP2 can be sealed with the resins MR and MR2 while a positional shift of the semiconductor chip CHP1 is suppressed. This means that according to the manufacturing method for the flow sensor of the first embodiment, a part of the semiconductor chip CHP1 and the whole area of the semiconductor chip CHP2 can be sealed with the resins MR and MR2 while a positional shift of each flow sensor is suppressed and that variation in the position of the flow detecting unit FDU formed on the semiconductor chip CHP1 can be suppressed.

As a result, according to the first embodiment, since the position of the flow detecting unit FDU that detects the flow rate of a gas is determined to be identical at each flow sensor, it is possible to obtain a remarkable effect that variation in the performance of each flow sensor in detection of a gas flow rate can be suppressed.

Hence, in the manufacturing method for the flow sensor of the first embodiment, the lead frame LF on which the semiconductor chip CHP1 is mounted is clamped between the upper mold UM and the lower mold BM such that the flow detecting unit FDU formed on the semiconductor chip CHP1 is surrounded by the first space SP1 isolated from the second space. Thereby, according to the first embodiment, the part of surface area of semiconductor chip CHP1 other than the flow detecting unit FDU and the area around it is sealed, while the flow detecting unit FDU formed on the semiconductor chip CHP1 and the area around the flow detecting unit FDU are left exposed.

Further, as shown in FIG. 18, in the first embodiment, the resin MR flows in also toward the back surface of the lead frame LF. Therefore, in the first embodiment, since the opening OP1 is formed on the bottom of the chip mounting part TAB1, a concern that the resin MR flows through the opening OP1 into the internal space of the diaphragm DF arises.

Therefore, to eliminate this concern, in the first embodiment, a specific shape of the lower mold BM clamping the lead frame LF is devised. Specifically, as shown in FIG. 18, a projecting insert piece IP1 is formed on the lower mold BM so that when the lead frame LF is clamped between the upper mold UM and the lower mold BM, the projecting insert piece IP1 formed on the lower mold BM is inserted in the opening OP1 formed on the bottom of the chip mounting part TAB1. Thereby, because the insert piece IP1 is inserted into the opening OP1 so tightly as to eliminate any gap, the resin MR is prevented from flowing though the opening OP1 into the internal space of the diaphragm DF. That is, in the first embodiment, the projecting insert piece IP1 is formed on the lower mold BM and is inserted in the opening OP1 formed on the bottom of the chip mounting part TAB1 when resin-sealing is performed.

Further, in the first embodiment, the shape of the insert piece IP1 is a devised one. Specifically, in the first embodiment, the insert piece IP1 is made up of an insert portion that is inserted in the opening OP1 and a pedestal portion that supports the insert portion, and the insert portion is larger in sectional area than the pedestal portion. As a result, the insert piece IP1 has a structure in which a stepped portion is formed between the insert portion and the pedestal portion, and this stepped portion is contacted closely to the bottom surface of the chip mounting part TAB1.

Configuring the insert piece IP1 in such a manner offers the following effects. For example, when the insert piece IP1 is made from the insert portion only, since the insert portion is inserted in the opening OP1, the diameter of the insert portion of the insert piece IP1 is slightly smaller than the diameter of the opening OP1. Therefore, when the insert piece IP1 is made from the insert portion only, a tiny gap is created between the insert portion and the opening O1 when the insert portion of the insert piece IP1 is inserted in the opening OP1. In this case, there is a possibility that the resin MR may flow through the gap into the internal space of the diaphragm DF.

Therefore, to prevent this from happening, in the first embodiment, the insert piece IP1 is structured such that the insert portion is formed on the pedestal portion larger in sectional area than the insert portion. In this case, as shown in FIG. 18, the insert portion of the insert piece IP1 is inserted in the opening OP1 as the pedestal portion of the insert piece IP1 is contacted closely to the bottom surface of the chip mounting part TAB1. As a result, even if a tiny gap is formed between the insert portion of the insert piece IP1 and the opening OP1, since the pedestal portion is pressed firmly against the back surface of the chip mounting part TAB1, it is possible to prevent the resin MR from flowing into the opening OP1. In other words, in the first embodiment, because of the structure of the insert piece IP1 in which the insert portion is formed on the pedestal portion larger in sectional area than the insert portion, by a combination of advantages that the pedestal portion prevents the resin MR from reaching the opening OP1 and that the stepped portion formed between the pedestal portion and the insert portion is pressed against the chip mounting part TAB1, the inflow of the resin MR to the internal space of the diaphragm FD via the opening OP1 can be prevented effectively.

After that, at the stage that the resin MR has cured, the lead frame LF on which the semiconductor chips CHP1 and CHP2 are mounted, is removed from the upper mold UM and the lower mold BM. In this manner, the flow sensor FS1 of the first embodiment is manufactured.

In the manufactured flow sensor FS1, as a result of use of the lower mold BM having the insert pieces IP1 during the resin-sealing process, for example, the opening OP1 is formed on the bottom surface of the chip mounting part TAB1 and the opening OP2 communicating with the opening OP1 is formed in the resin MR, as shown in FIG. 7(*b*). The opening OP2 is formed as a result of formation of the pedestal portion on the insert pieces IP1, and the opening OP2 is larger in sectional area than the opening OP1. Thereby, according to the flow sensor FS1 of the first embodiment, the internal space of the diaphragm DF communicates with an external space outside the flow sensor FS1 via the opening OP1 formed on the bottom of the chip mounting part TAB1 and the opening OP2 formed in the resin MR. As a result, the pressure of the internal space of the diaphragm DF can be made equal to the pressure of the external space outside the flow sensor FS1, thus stress application to the diaphragm DF can be suppressed.

<Typical Effects of First Embodiment>

According to the flow sensor FS1 of the first embodiment, it is possible to obtain the following typical effects.

(1) In the first embodiment, for example, as shown in FIG. 12, the pressure of injection of the resin MR creates a gap on the contact part SEL where the elastic film LAF and the semiconductor chip CHP1 are in contact, and the resin MR2 infiltrates into the gap. As a result, according to the first embodiment, as shown in FIGS. 7(*a*) to 7(*c*), in the area of semiconductor chip CHP1 that is exposed from the resin MR, the resin MR2 is formed in the area other than the flow detecting unit FDU and the area around it. According to the first embodiment, therefore, the area of semiconductor chip CHP1 that is exposed from the resins MR and MR2 can be reduced in size. In other words, according to the first embodiment, the area where the silicon material, which is the main constituent of the semiconductor chip CHP1, is exposed can be reduced in size. As a result, it is possible to suppress that the semiconductor chip CHP1 is broken by an external load, such as heat stress cause by impact and temperature changes.

(2) Further, according to the first embodiment, as shown in FIGS. 7(a) to 7(c), in the surface area of the semiconductor chip CHP1, the area covered with the resin MR or resin MR2 can be increased in size. As a result, the area of contact between the semiconductor chip CHP1 and the resin MR or MR2 becomes large, and this prevents separation of the resin MR from the semiconductor chip CHP1 or the resin MR2 from the semiconductor chip CHP1. Therefore, the flow sensor FS1 of the first embodiment can offer improved reliability.

(3) Furthermore, in the first embodiment, the pressure of injection of the resin MR creates a gap on the contact part SEL where the elastic film LAF and the semiconductor chip CHP1 are in contact, and the resin MR2 different in constituent from the resin MR infiltrates into the gap. Specifically, according to the first embodiment, the volume of the coloring material and filler included in the resin MR2 is smaller than the volume of the coloring material and filler included in the resin MR. Therefore, since the resin MR2 having infiltrated into the gap between elastic film LAF and the semiconductor chip CHP1 contains less volume of coloring material and filler, the resin MR becomes transparent to, for example, visible light. As a result, according to the first embodiment, even if the ID number NUM is covered with the resin MR2, as shown in FIG. 7(a), the ID number NUM covered with the resin MR2 remains recognizable because the resin MR2 is transparent. Hence, according to the first embodiment, the ID number NUM formed on the semiconductor chip CHP1 can be used effectively for product management, etc.

(4) According to the first embodiment, for example, as shown in FIG. 11, the contact part SEL where the elastic film LAF and the semiconductor chip CHP1 are in contact is located such that the contact part SEL does not overlap the diaphragm DF in a plan view. As a result, according to the first embodiment, the diaphragm DF whose thickness is thin is not disposed in the area underneath the contact part SEL where the elastic film LAF and the semiconductor chip CHP1 are in contact. Therefore, since it is possible to prevent the pressure to the upper mold UM from being applied directly to the thin diaphragm DF via the contact part SEL where the elastic film LAF and the semiconductor chip CHP1 are in contact, thus damage to the semiconductor chip CHP1 can be suppressed.

(5) According to the first embodiment, the pressure of injection of the resin MR creates a gap on the contact part SEL where the elastic film LAF and the semiconductor chip CHP1 are in contact, and the resin MR2 infiltrates into the gap. Therefore, in the first embodiment, the pressure applied from the upper mold UM to the semiconductor chip CHP1 via the elastic film LAF is weakened. Specifically, the pressure to the upper mold UM is weakened to the extent that the pressure of injection of the resin MR deforms the elastic film LAF and creates a gap on the contact part SEL where the elastic film LAF and the semiconductor chip CHP1 are in contact. In this manner, in the first embodiment, since the downward pressure from the upper mold UM that is exerted onto the semiconductor chip CHP1 via the elastic film LAF is weakened, it is possible to obtain the effect of preventing damage to the semiconductor chip CHP1.

(6) As described above, the basic concept of the first embodiment is to create a gap on the contact part SEL where the elastic film LAF and the semiconductor chip CHP1 are in contact, by the pressure of injection of the resin MR and to cause the resin MR2 to infiltrate into the gap. This basic concept is a novel concept totally different from the concept of the related technique. In other words, for example, the related technique usually requires that the contact part SEL where the elastic film LAF and the semiconductor chip CHP1 are in contact have sufficient sealing performance against resin leakage. In this case, because the contact part SEL is not covered with the resin MR, the contact part SEL becomes the area where the semiconductor chip CHP1 is exposed after the molding process. In contrast, the basic concept of the first embodiment disproves the conventional idea, offering a configuration in which the pressure of injection of the resin MR creates a gap on the contact part SEL where the elastic film LAF and the semiconductor chip CHP1 are in contact, and the resin MR2 infiltrates into the gap. As a result, according to the first embodiment, since the contact part SEL is also covered with the resin MR, the exposed area of the semiconductor chip CHP1 after the molding process can be made small, and damage to the semiconductor chip CHP1 can be suppressed effectively.

First Modification

A first modification will be described as an example in which the contact part SEL where the elastic film LAF and the semiconductor chip CHP1 are in contact, is located in an area overlapping the diaphragm DF in a plan view.

FIG. 19 is a sectional view showing a resin-sealing process on a flow sensor according to a first modification. In FIG. 19, the size of the first space SP1 enclosing the flow detecting unit FDU therein is smaller than the size of the diaphragm DF, and the upper mold UM with the elastic film LAF attached thereto is disposed such that in a plan view, the first space SP1 is included in the diaphragm DF. In other words, the contact part SEL where the elastic film LAF and the semiconductor chip CHP1 are in contact is located such that the contact part SEL overlaps the diaphragm DF in a plan view.

At this time, also in the first modification, the pressure of injection of the resin MR creates a gap on the contact part SEL where the elastic film LAF and the semiconductor chip CHP1 are in contact, and the resin MR2 infiltrates into the gap.

Hence, according to the first modification, in the area of semiconductor chip CHP1 that is exposed from the resin MR, the resin MR2 is formed in the area other than the flow detecting unit FDU and the area around it, and the size SL of the first space SP1 enclosing the flow detecting unit FDU therein can be reduced. Thereby, according to the first modification, because the size SL of the first space SP1 is reduced to be smaller than the same of the first embodiment, the area of semiconductor chip CHP1 that is exposed from the resins MR and MR2 is reduced further in size.

Here, in the first modification, the thin diaphragm DF is disposed in the area underneath the contact part SEL where the elastic film LAF and the semiconductor chip CHP1 are in contact. Therefore, because a pressure to the upper mold UM is applied directly to the thin diaphragm DF via the contact part SEL where the elastic film LAF and the semiconductor chip CHP1 are in contact, in which case it is assumed that damage to the semiconductor chip CHP1 cannot be sufficiently suppressed. However, relating to this point, also in the first modification, the pressure applied from the upper mold UM to the semiconductor chip CHP1 via the elastic film LAF is weakened. Specifically, the pressure to the upper mold UM is weakened to the extent that the pressure of injection of the resin MR deforms the elastic film LAF and creates a gap on the contact part SEL where the elastic film LAF and the semiconductor chip CHP1 are in contact. In the first modification, therefore, the downward pressure from the upper mold UM that is exerted onto the semiconductor chip CHP1 via the elastic film LAF is weakened in the same manner as in the first embodiment. Hence, even when the configuration in which the thin diaphragm DF is disposed in the area underneath the contact part SEL where the elastic film LAF and the semiconductor chip CHP1 are in contact, is adopted, damage to the semiconductor chip CHP1 can be prevented.

Second Modification

A second modification will be described as an example in which the part of surface area of semiconductor chip CHP1 that is other than the flow sensor detecting unit FDU and the area around it is covered with the resin MR2 only.

FIG. 20 is a sectional view showing a resin-sealing process on a flow sensor according to the second modification. In FIG. 20, the contact part SEL where the elastic film LAF and the semiconductor chip CHP1 are in contact, is formed to the edge of the semiconductor chip CHP1. At this time, also in the second modification, the pressure of injection of the resin MR creates a gap on the contact part SEL where the elastic film LAF and the semiconductor chip CHP1 are in contact, and the resin MR2 infiltrates into the gap. As a result, in the second modification, the part of surface area of semiconductor chip CHP1 that is other than the flow sensor detecting unit FDU and the area around it is covered with the resin MR2 only. Also in this case, because the area of semiconductor chip CHP1 that is exposed from the resin MR2 is reduced in size, damage to the semiconductor chip CHP1 can be suppressed.

Third Modification

A third modification will be described as an example in which the elastic film is not used in the resin-sealing process on a flow sensor.

FIG. 21 is a sectional view showing a resin-sealing process on the flow sensor according to a third modification. In FIG. 21, in the resin-sealing process on the flow sensor of the third embodiment, the elastic film is not attached to the bottom surface of the upper mold UM. In this case, as shown in FIG. 21, the upper mold UM and the semiconductor chip CHP1 are in contact, and a gap is formed between them.

In other words, in the first embodiment, the contact part SEL where the elastic film LAF and the semiconductor chip CHP1 are in contact, is formed, and the pressure of injection of the resin MR deforms the elastic film LAF and creates a gap on the contact part SEL and the resin MR2 infiltrates into the gap.

The third modification is different from the first embodiment in that the upper mold UM is disposed such that the upper mold UM and the semiconductor chip CHP1 are not in contact in advance so that a gap is formed between the upper mold UM and the semiconductor chip CHP1.

Also in the third modification that offers such a configuration, the resin MR2 flows into the above gap. As a result, according to the third modification, also in the area of semiconductor chip CHP1 that is exposed from the resin MR, the resin MR2 is formed in the area other than the flow detecting unit FDU and the area around it. According to the third modification, therefore, the area of semiconductor chip CHP1 that is exposed from the resins MR and MR2 is reduced in size.

In particular, also in the third modification, it is preferable that the gap be reduced to a gap of a specific size into which the coloring material and filler in their clustered state hardly flow. In such a case, also in the third modification, the volume of the coloring material and filler included in the resin MR2 is smaller than the volume of the coloring material and filler contained in the resin MR. Therefore, since the resin MR2 having infiltrated into the gap between the upper mold UM and the semiconductor chip CHP1 contains less volume of coloring material and filler, and the resin MR becomes transparent to, for example, visible light.

In addition, in the third modification, the upper mold UM and the semiconductor chip CHP1 are not in contact. Because of this configuration, the problem that the semiconductor chip CHP1 is apt to crack does not arise, for example, not only in the case of locating the gap between the upper mold UM and the semiconductor chip CHP1 at the position at which the gap does not overlap the diaphragm DF in a plan view but also in the case of locating the gap at the position at which the gap overlaps the diaphragm DF. This is because that according to the third modification, the upper mold UM and the semiconductor chip CHP1 are not brought into contact in the first place and therefore the pressure of the upper mold UM is never applied to the semiconductor chip CHP1. For this reason, in the third modification, when the size of the first space SP1 enclosing the flow detecting unit FDU therein is reduced and the gap between the upper mold UM and the semiconductor chip CHP1 is located, for example, at the position at which the gap overlaps the diaphragm DF in a plan view, the area of semiconductor chip CHP1 that is exposed from the resins MR and MR2 is reduced in size regardless of the pressure of the upper mold UM.

Second Embodiment

Although the first embodiment is described as the example in which the diaphragm DF is formed on the back surface of the semiconductor chip CHP1 by using the etching technique, a second embodiment will be described as an example in which, for example, the diaphragm DF is formed on the back surface of the semiconductor chip CHP1 by using the sand-blasting technique.

FIG. 22 is a view of amounting configuration of the flow sensor FS1 according to the second embodiment, showing a configuration of the flow sensor FS1 after sealed with a resin. In particular, FIG. 22($a$) is a plan view of a mounting configuration of the flow sensor FS1 according to the second embodiment. FIG. 22($b$) is a sectional view of FIG. 22($a$) taken along an A-A line, and FIG. 22($c$) is a sectional view of FIG. 22($a$) taken along a B-B line.

The mounting configuration of the flow sensor FS1 of the second embodiment depicted in FIGS. 22($a$) to 22($c$) is almost the same as the mounting configuration of the flow sensor FS1 of the first embodiment depicted in FIGS. 7($a$) to 7($c$). The mounting configuration of the flow sensor FS1 of the second embodiment is different from the mounting configuration of the flow sensor FS1 of the first embodiment in that while the sloped diaphragm DF is formed in the first embodiment because of use of the etching technique, the square-slot-shaped diaphragm DF is formed in the second embodiment as a result of use of sand-blasting technique.

Also in the flow sensor FS1 of the second embodiment configured in such a manner, in the area of semiconductor chip CHP1 that is exposed from the resin MR, the resin MR2 is formed in the area other than the flow detecting unit FDU and the area around it, as in the first embodiment. Also, according to the second embodiment, therefore, the area of semiconductor chip CHP1 that is exposed from the resins MR and MR2 can be reduced in size. In other words, according to the second embodiment, the area where the silicon material, which is the main constituent of the semiconductor chip CHP1, is exposed can be reduced in size. As a result, it is possible to suppress a case where the semiconductor chip CHP1 is broken by an external load, such as heat stress cause by impact and temperature changes.

Further, also, according to the second embodiment, in the surface area of the semiconductor chip CHP1, the area covered with the resin MR or MR2 can be increased in size, as in the first embodiment. As a result, the area of contact between the semiconductor chip CHP1 and the resin MR or MR2 increases in size, it is possible to prevent separation of the resin MR from the semiconductor chip CHP1 or the resin MR2 from the semiconductor chip CHP1. Therefore, the flow sensor FS1 of the second embodiment can offer improved reliability.

At this time, in the flow sensor FS1 of the second embodiment, the resin MR and the resin MR2 are different in constituent from each other. That is, both of the resins MR and MR2 include, for example, the resin, such as epoxy resin, the filler made of silica, glass, carbon, mica, talc, etc., and the coloring material. However, the volume of the filler and coloring material included in the resin MR is different from the volume of the filler and coloring material included in the resin MR2. More specifically, the volume of the filler and coloring material included in the resin MR2 is smaller than the volume of the filler and coloring material included in the resin MR.

In this manner, in the flow sensor FS1 of the second embodiment, because the volume of the filler and coloring material included in the resin MR2 is smaller than the volume of the filler and coloring material included in the resin MR, the resin MR2, for example, becomes transparent. For this reason, even if an area covered with the resin MR2 is present in the surface area of the semiconductor chip CHP1, the ID number NUM formed on the semiconductor chip CHP1 can be recognized. As described above, the flow sensor FS1 of the second embodiment can obtain the same effect as offered by the flow sensor FS1 of the first embodiment.

Third Embodiment

The flow sensor FS1 according to a third embodiment will then be described. The first embodiment is described as the example in which the semiconductor chip CHP1 is placed on the chip mounting part TAB1 via the adhesive ADH1, as shown in FIGS. 7(b) and 7(c). The third embodiment will be described as an example in which, for example, a plate-like structure PLT is inserted between the semiconductor chip CHP1 and the chip mounting part TAB1, as shown in FIG. 23.

FIG. 23 depicts the structure of the flow sensor FS1 after sealed with a resin, according to the third embodiment. FIG. 23(a) is a plan view of the structure of the flow sensor FS1 after sealed with the resin. FIG. 23(b) is a sectional view of FIG. 23(a) taken along an A-A line, and FIG. 23(c) is a sectional view of FIG. 23(a) taken along a B-B line.

As shown in FIGS. 23(b) and 23(c), in the flow sensor FS1 of the third embodiment, the plate-like structure PLT is formed to extend under the semiconductor chips CHP1 and CHP2. The plate-like structure PLT is, for example, rectangular in shape, and has outline dimensions large enough to include the semiconductor chips CHP1 and CHP2 in a plan view. That is, in the third embodiment, the plate-like structure PLT is mounted on the chip mounting parts TAB1 and TAB2 via an adhesive ADH2, and the semiconductor chips CHP1 and CHP2 are mounted on this plate-like structure PLT via the adhesive ADH1.

Further, a slot DPLT is formed on the plate-like structure PLT, and through this slot DPLT, the internal space of the diaphragm DF formed on the semiconductor chip CHP1 and an opening OP3 formed on the resin MR are connected. As a result, the pressure of the internal space of the diaphragm DF is made equal to the pressure of the external space outside the flow sensor FS1, and stress application to the diaphragm DF can be suppressed.

Here, in the third embodiment, the opening OP3 formed on the resin MR is located in an area where the opening OP3 does not overlap the diaphragm DF in a plan view, this advantage of the third embodiment will be described. For example, in the first embodiment shown in FIG. 7(b), the opening OP2 is formed in the area underneath the diaphragm DF where the opening OP2 overlaps the diaphragm DF in a plan view. In this case, the internal space of the diaphragm DF is connected communicatively to the external space outside the flow sensor FS1 via the openings OP1 and OP2, so that the pressure of the internal space of the diaphragm DF can be made equal to the pressure of the external space outside the flow sensor FS1.

In this configuration, however, the opening OP2 is located in a place where a gas flows. That is, in the external space near the opening OP2, a flow of the gas destabilizes the pressure of the external space. In other words, when the internal space of the diaphragm DF is connected communicatively to the external space through the opening OP2 formed in the area underneath the diaphragm DF, the flow of the gas in the external space may cause destabilization of the pressure of the internal space of the diaphragm DF caused by the flow of gas in the external space.

To avoid such a case, in the third embodiment, for example, as shown in FIG. 23(b), the opening OP3 formed on the resin MR is located in the area where the opening OP3 does not overlap the diaphragm DF in a plane view so that the opening OP3 is separated from the place where the gas flows. As a result, according to the third embodiment, the pressure of the internal space of the diaphragm DF can be stabilized without being affected by the flow of the gas. Hence, according to the third embodiment, by forming the opening OP3 in the place hardly affected by the flow of the gas, the pressure of the internal space of the diaphragm DF is made equal to the pressure of the external space outside the flow sensor FS1 and at the same time, the pressure of the internal space of the diaphragm DF can be stabilized.

According to the third embodiment, for example, as shown in FIG. 23(b), the plate-like structure PLT is placed on the chip mounting parts TAB1 and TAB2. The plate-like structure PLT is bonded to the chip mounting part TAB1 and to the chip mounting part TAB2, using, for example, the adhesive ADH2. However, the plate-like structure PLT may be joined to both chip mounting parts using a paste material.

On the plate-like structure PLT, the semiconductor chip CHP1 as well as the semiconductor chip CHP2 are mounted via the adhesive ADH1. When the plate-like structure PLT is made of a metal material, the plate-like structure PLT may be connected to the semiconductor chip CHP1 and to the semiconductor chip CHP2 via wires.

The plate-like structure PLT functions mainly as a material that improves the rigidity of the flow sensor FS1 or a buffering material that buffers incoming external impact. FIG. 23(b) depicts an example in which the pads PD1 of the semiconductor chip CHP1 are connected directly to the pads PD2 of the semiconductor chip CHP2 via gold wires. When the plate-like structure PLT is made of a conductive material, however, the plate-like structure PLT may be electrically connected to the semiconductor chip CHP1 (pads PD1) and to the semiconductor chip CHP2 (pads PD2) to use the plate-like structure PLT for supplying a ground potential (reference potential) or stabilizing the ground potential. For example, when the plate-like structure PLT is made of a material with high rigidity, such as metal material, the rigidity of the flow sensor FS1 can be improved. On the other hand, when the plate-like structure PLT is made of a material with low rigidity, such as resin material, variation in the mounting heights of components clamped between the upper mold UM and the lower mold BM during the resin-sealing process can be absorbed by the deformation of the plate-like structure PLT.

The plate-like structure PLT may be made of, for example, a thermoplastic resin, such as PBT resin, ABS resin, PC resin, nylon resin, PS resin, PP resin, and fluoro resin, or a thermosetting resin, such as epoxy resin, phenol resin, and urethane resin. In this case, the plate-like structure PLT can function mainly as a buffering material that protects the semiconductor chips CHP1 and CHP2 from external impact.

On the other hand, the plate-like structure PLT may be formed by press working a metal material, such as iron alloy, aluminum alloy, and copper alloy, or by processing a glass material. In particular, when the plate-like structure PLT is made from a metal material, the rigidity of the flow sensor FS1 can be improved. The plate-like structure PLT may be electrically connected to the semiconductor chip CHP1 and the semiconductor chip CHP2 to use the plate-like structure PLT for supplying a ground potential (reference potential) or stabilizing the ground potential.

In addition, when the plate-like structure PLT is made of the thermoplastic resin or the thermosetting resin, the thermoplastic resin and the thermosetting resin may include an inorganic filler, such as glass, talc, silica, and mica, or an organic filler, such as carbon. The plate-like structure PLT may be formed by transfer molding by which a resin injected into molding-dies is molded into the plate-like structure PLT or by roll processing by which sheets of materials are laminated arbitrarily into the plate-like structure PLT.

The adhesive ADH1 bonding the semiconductor chips CHP1 and CHP2 to the plate-like structure PLT and the adhesive ADH2 bonding the plate-like structure PLT to the chip mounting parts TAB1 and TAB2 are each provided as, for example, an adhesive made of a thermosetting resin, such as epoxy resin and polyurethane resin, or as an adhesive made of a thermoplastic resin, such as polyimide resin, acrylic resin, and fluoro resin. Each of the adhesives ADH1 and AHD2 made mainly of the thermosetting resin or thermoplastic resin may be given conductivity and have its linear expansion coefficient controlled, by adding a metal material, such as gold, silver, copper, and tin, or an inorganic material, such as silica, glass, carbon, mica, and talc, to the adhesives ADH1 and AHD2.

Also in the flow sensor FS1 of the third embodiment configured in such a manner, in the area of semiconductor chip CHP1 that is exposed from the resin MR, the resin MR2 is formed in the area other than the flow detecting unit FDU and the area around it. According to the third embodiment, therefore, the area of semiconductor chip CHP1 that is exposed from the resins MR and MR2 can be reduced in size. In other words, according to the third embodiment, the area where the silicon material, which is the main constituent of the semiconductor chip CHP1, is exposed can be reduced in size. As a result, it is possible to prevent a case where the semiconductor chip CHP1 is broken by an external load, such as heat stress cause by impact and temperature changes.

Further, also, according to the third embodiment, in the surface area of the semiconductor chip CHP1, the area covered with the resin MR or MR2 can be increased in size. As a result, the area of contact between the semiconductor chip CHP1 and the resin MR or MR2 increases, and it is possible to prevent separation of the resin MR from the semiconductor chip CHP1 or the resin MR2 from the semiconductor chip CHP1. Therefore, the flow sensor FS1 of the third embodiment can improve reliability.

At this time, in the flow sensor FS1 of the third embodiment, the resin MR and the resin MR2 are different in constituent from each other. Both of the resins MR and MR2 include, for example, the resin, such as epoxy resin, the filler made of silica, glass, carbon, mica, talc, etc., and the coloring material. However, the volume of the filler and coloring material included in the resin MR is different from the volume of the filler and coloring material included in the resin MR2. More specifically, the volume of the filler and coloring material included in the resin MR2 is smaller than the volume of the filler and coloring material included in the resin MR.

In this manner, in the flow sensor FS1 of the third embodiment, because the volume of the filler and coloring material included in the resin MR2 is smaller than the volume of the filler and coloring material included in the resin MR, the resin MR2, for example, becomes transparent. For this reason, even if an area covered with the resin MR2 is present in the surface area of the semiconductor chip CHP1, the ID number NUM formed on the semiconductor chip CHP1 can be recognized. As described above, also in the flow sensor FS1 of the third embodiment, it is possible to obtain the same effect as offered by the flow sensor FS1 of the first embodiment.

Fourth Embodiment

In the first embodiment, for example, as shown in FIG. 7(b), the flow sensor FS1 of the double-chip structure having the semiconductor chips CHP1 and CHP2 is described as an example. The technical concept of the present invention is not limited to this and can be applied not only to the flow sensor of the double-chip structure but also to, for example, a flow sensor of a single-chip structure having a single semiconductor chip carrying the flow detecting unit and a control unit (control circuit) formed integrally together. A fourth embodiment will be described as an example in which the technical concept of the present invention is applied to the flow sensor of the single-chip structure.

<Mounting Configuration of the Flow Sensor in the Fourth Embodiment>

FIG. 24 is a view of a mounting configuration of a flow sensor FS2 in the fourth embodiment, showing a configuration of the flow sensor FS2 after sealed with a resin. In particular, FIG. 24(a) is a plan view of a mounting configuration of the flow sensor FS2 according to the fourth embodiment. FIG. 24(b) is a sectional view of FIG. 24(a) taken along an A-A line, and FIG. 24(c) is a sectional view of FIG. 24(a) taken along a B-B line. Especially, FIG. 24(b)

depicts a section parallel to the direction of advance of a gas flowing over the exposed flow detecting unit FDU, and in FIG. 24(b), the gas flows, for example, from left to right along the X-axis.

At first, as shown in FIG. 24(a), the flow sensor FS2 of the fourth embodiment has the sealing body including the rectangular rein MR, from which the leads LD2 stick out. A part of the semiconductor chip CHP1 is exposed from the upper surface (surface) of the resin MR. In particular, on the semiconductor chip CHP1, the flow detecting unit FDU and the control unit that controls the flow detecting unit FDU are formed. Specifically, the flow detecting unit FDU formed on the semiconductor chip CHP1 is connected electrically to the control unit via the wires WL1. The control unit is covered with the resin MR and is therefore not depicted in FIG. 24(a), which means that the control unit is buried in the resin MR. The flow sensor FS2 of the fourth embodiment is thus configured such that it has the semiconductor chip CHP1 carrying the flow detecting unit FDU and control unit formed integrally together, and the flow detecting unit FDU being exposed from the resin MR.

Next, as shown in FIG. 24(b), in the flow sensor FS2 of the fourth embodiment, the semiconductor chip CHP1 is mounted on the chip mounting part TAB1 via the adhesive ADH1. At this time, the flow detecting unit FDU is formed on the upper surface (surface, main surface) of the semiconductor chip CHP1, while the diaphragm DF (thin plate portion) is formed on the part of back surface of semiconductor chip CHP1 that is counter to the flow detecting unit FDU. On the other hand, the opening OP1 is formed on the bottom of the chip mounting part TAB1 situated under the diaphragm DF.

In addition, the adhesive ADH1 bonding the semiconductor chip CHP1 to the chip mounting part TAB1 is provided as, for example, an adhesive made of a thermosetting resin, such as epoxy resin and polyurethane resin, or as an adhesive made of a thermoplastic resin, such as polyimide resin, acrylic resin, and fluoro resin. The adhesives ADH1 made mainly of the thermosetting resin or thermoplastic resin may be given conductivity and have its linear expansion coefficient controlled, by adding a metal material, such as gold, silver, copper, and tin, and an inorganic material, such as silica, glass, carbon, mica, and talc, to the adhesive ADH1.

Here, as shown in FIG. 24(b), in the flow sensor FS2 of the fourth embodiment, the resin MR is so formed as to cover the side faces and part of the upper surface of the semiconductor chip CHP1 and a part of the chip mounting part TAB1.

At this time, in the fourth embodiment, the opening OP1 is formed on the bottom of the chip mounting part TAB1 situated under the diaphragm DF formed on the back surface of the semiconductor chip CHP1, and the opening OP2 is also formed on the resin MR covering the back surface of the chip mounting part TAB1.

Thereby, according to the flow sensor FS2 of the fourth embodiment, the internal space of the diaphragm DF communicates with an external space outside the flow sensor FS2 via the opening OP1 formed on the bottom of the chip mounting part TAB1 and the opening OP2 formed on the resin MR. As a result, the pressure of the internal space of the diaphragm DF can be made equal to the pressure of the external space outside the flow sensor FS2, and stress application to the diaphragm DF can be suppressed.

In addition, as shown in FIG. 24(c), the semiconductor chip CHP1 is mounted on the chip mounting part TAB1 via the adhesive ADH1 and on the upper surface of this semiconductor chip CHP1, the flow detecting unit FDU and the control unit CU are formed. In other words, in the fourth embodiment, the flow detecting unit FDU and the control unit CU are formed integrally together on the semiconductor chip CHP1. Further, the pads PD are formed on the upper surface of the semiconductor chip CHP1, where the pads PD are electrically connected to the leads LD2 via the wires W. The control unit CU, pads PD, and wires W formed on the upper surface of the semiconductor chip CHP1 are sealed with the resin MR.

Also in the flow sensor FS2 of the fourth embodiment configured in such a manner, in the area of semiconductor chip CHP1 that is exposed from the resin MR, the resin MR2 is formed in the area other than the flow detecting unit FDU and the area around it. Thereby, also in the fourth embodiment, the area of semiconductor chip CHP1 that is exposed from the resins MR and MR2 can be reduced in size. In other words, according to the fourth embodiment, the area where the silicon material, which is the main constituent of the semiconductor chip CHP1, is exposed can be reduced in size. As a result, it is possible to suppress a case where the semiconductor chip CHP1 is broken by an external load, such as heat stress cause by impact and temperature changes.

Further, also, according to the fourth embodiment, in the surface area of the semiconductor chip CHP1, the area covered with the resin MR or MR2 can be increased in size. As a result, the area of contact between the semiconductor chip CHP1 and the resin MR or MR2 increases, and it is possible to prevent separation of the resin MR from the semiconductor chip CHP1 or the resin MR2 from the semiconductor chip CHP1. Therefore, the flow sensor FS2 of the fourth embodiment can improve reliability.

At this time, in the flow sensor FS2 of the fourth embodiment, the resin MR and the resin MR2 are different in constituent from each other. That is, both of the resins MR and MR2 include, for example, the resin, such as epoxy resin, the filler made of silica, glass, carbon, mica, talc, etc., and the coloring material. However, the volume of the filler and coloring material included in the resin MR is different from the volume of the filler and coloring material included in the resin MR2. More specifically, the volume of the filler and coloring material included in the resin MR2 is smaller than the volume of the filler and coloring material included in the resin MR.

In this manner, in the flow sensor FS2 of the fourth embodiment, because the volume of the filler and coloring material included in the resin MR2 is smaller than the volume of the filler and coloring material included in the resin MR, the resin MR2, for example, becomes transparent. For this reason, even if an area covered with the resin MR2 is present in the surface area of the semiconductor chip CHP1, the ID number NUM formed on the semiconductor chip CHP1 can be recognized. As described above, the flow sensor FS2 of the fourth embodiment can also obtain the same effect as offered by the flow sensor FS1 of the first embodiment.

In the foregoing, the invention made by the present inventors has been concretely described based on the embodiments. However, it is needless to say that the present invention is not limited to the foregoing embodiments and various modifications and alterations can be made within the scope of the present invention.

For example, the opening OP1 of the chip mounting part TAB1 placed in the area underneath the diaphragm DF formed on the semiconductor chip CHP1 and the slot DPLT of the plate-like structure PLT may not be formed. Further, such components as a capacitor, thermistor, control circuit, memory, transistor, resistor, and heater may be mounted on the lead frame LF.

The flow sensor described in the above embodiments is a device that measures the flow rate of a gas. However, specific kind of gas is not limited, and the flow sensor is used as a device that measures the flow rates of a wide variety of gases, such as air, LP gas, carbon dioxide gas ($CO_2$ gas), chlorofluorocarbon gas.

Further, the flow sensor that measures the flow rate of a gas has been described in the above embodiments. The technical concept of the present invention is, however, applied not only to such a flow sensor but also to a semiconductor device in which a semiconductor element, such as temperature sensor, is sealed with a resin such that apart of the semiconductor element is left exposed from the resin.

EXPLANATIONS OF SYMBOLS

1 CPU
2 Input circuit
3 Output circuit
4 Memory
A Node
ADH1 adhesive
B Node
BM lower mold
BR1 Downstream temperature-measuring resistor
BR2 Downstream temperature-measuring resistor
C Node
CHP1 Semiconductor chip
CHP2 Semiconductor chip
CLK Crack
CLS Coloring material
CU Control unit
D Node
DF Diaphragm
DM Dam bar
DPLT Slot
EP Epoxy resin
FDU Flow detecting unit
FSP Flow sensor
FS1 Flow sensor
FS2 Flow sensor
FUL Filler
HCB Heater control bridge
HR Heating resistor
IP1 Insert piece
LAF Elastic film
LD1 Lead
LD2 Lead
LF Lead frame
MR Resin
MR2 Resin
NUM ID number
OP1 Opening
OP2 Opening
OP3 Opening
PD1 Pad
PD2 Pad
PD3 Pad
PLT Plate-like structure
PS Power supply
Q Gas flow rate
R1 Resistor
R2 Resistor
R3 Resistor
R4 Resistor
SEL Contact part
SL Size
SP1 First space
SP2 Second space
TAB1 Chip mounting part
TAB2 Chip mounting part
Tr Transistor
TSB Temperature sensor bridge
UM Upper mold
UR1 Upstream temperature-measuring resistor
UR2 Upstream temperature-measuring resistor
Vref1 Reference voltage
Vref2 Reference voltage
WL1 Line
W1 Wire
W2 Wire
W3 Wire

The invention claimed is:

1. A manufacturing method for a flow sensor comprising:
a first chip mounting part; and
a first semiconductor chip mounted on the first chip mounting part, the first semiconductor chip including:
a flow detecting unit formed on a main surface of a first semiconductor substrate; and
a diaphragm formed in an area of a back surface of the first semiconductor substrate opposite to the main surface of the first semiconductor substrate, the area being counter to the flow detecting unit, wherein
a part of the first semiconductor chip is sealed with a sealing body while the flow detecting unit formed on the first semiconductor chip is left exposed,
the manufacturing method for the flow sensor comprising:
(a) a step of preparing a base material having the first chip mounting part;
(b) a step of preparing the first semiconductor chip;
(c) a step of mounting the first semiconductor chip on the first chip mounting part; and
(d) a step of sealing a part of the first semiconductor chip with the sealing body while leaving the flow detecting unit formed on the first semiconductor chip exposed, following the step (c), the step (d) including:
(d1) a step of preparing an upper mold and a lower mold;
(d2) a step of clamping the base material carrying the first semiconductor chip between the upper mold and the lower mold via a second space while pressing a part of the upper mold against a surface of the first semiconductor chip via an elastic film to form a first space surrounding the flow detecting unit between the upper mold and the first semiconductor chip, following the step (d1);
(d3) a step of leading a first resin including a filler and a coloring material into the second space, following the step (d2);
(d4) a step of curing the first resin to form the sealing body, following the step (d3); and
(d5) a step of parting the sealing body from the lower mold, following the step (d4), wherein
at the step (d3), a pressure of injection of the first resin causes a second resin different in constituent from the first resin to infiltrate into a gap between the surface of the first semiconductor chip and the elastic film, and wherein a volume of the filler and coloring material included in the second resin is smaller than a volume of the filler and coloring material included in the first resin.

2. A manufacturing method for a flow sensor comprising:
a first chip mounting part; and
a first semiconductor chip mounted on the first chip mounting part, the first semiconductor chip including:
a flow detecting unit formed on a main surface of a first semiconductor substrate; and
a diaphragm formed in an area of a back surface of the first semiconductor substrate opposite to the main surface of the first semiconductor substrate, the area being counter to the flow detecting unit, wherein
a part of the first semiconductor chip is sealed with a sealing body while the flow detecting unit formed on the first semiconductor chip is left exposed,
the manufacturing method for the flow sensor comprising:
(a) a step of preparing a base material having the first chip mounting part;
(b) a step of preparing the first semiconductor chip;
(c) a step of mounting the first semiconductor chip on the first chip mounting part; and
(d) a step of sealing a part of the first semiconductor chip with the sealing body while leaving the flow detecting unit formed on the first semiconductor chip exposed, following the step (c), the step (d) including:
(d1) a step of preparing an upper mold and a lower mold;
(d2) a step of clamping the base material carrying the first semiconductor chip between the upper mold and the lower mold via a second space while forming a gap between a surface of the first semiconductor chip and the upper mold and forming a first space surrounding the flow detecting unit, following the step (d1);
(d3) a step of leading a first resin including a filler and a coloring material into the second space, following the step (d2);
(d4) a step of curing the first resin to form the sealing body, following the step (d3); and
(d5) a step of parting the sealing body from the lower mold, following the step (d4), wherein
at the step (d3), a pressure of injection of the first resin causes a second resin different in constituent from the first resin to infiltrates into the gap formed between the surface of the first semiconductor chip and the upper mold, and wherein
a volume of the filler and coloring material included in the second resin is smaller than a volume of the filler and coloring material included in the first resin.

3. A flow sensor made according to the manufacturing method of claim 1.

4. A flow sensor made according to the manufacturing method of claim 2.

* * * * *